United States Patent
Ohtsuki et al.

(10) Patent No.: US 12,482,647 B2
(45) Date of Patent: Nov. 25, 2025

(54) METHOD FOR FORMING THERMAL OXIDE FILM ON SEMICONDUCTOR SUBSTRATE

(71) Applicant: SHIN-ETSU HANDOTAI CO., LTD., Tokyo (JP)

(72) Inventors: Tsuyoshi Ohtsuki, Annaka (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 519 days.

(21) Appl. No.: 17/922,506

(22) PCT Filed: Mar. 10, 2021

(86) PCT No.: PCT/JP2021/009514
§ 371 (c)(1),
(2) Date: Oct. 31, 2022

(87) PCT Pub. No.: WO2021/240948
PCT Pub. Date: Dec. 2, 2021

(65) Prior Publication Data
US 2023/0268175 A1    Aug. 24, 2023

(30) Foreign Application Priority Data

May 26, 2020  (JP) ................................ 2020-091049
Jun. 24, 2020  (JP) ................................ 2020-108411
(Continued)

(51) Int. Cl.
*H01L 21/02*        (2006.01)
*H01L 21/324*       (2006.01)

(52) U.S. Cl.
CPC .. *H01L 21/02164* (2013.01); *H01L 21/02052* (2013.01); *H01L 21/0228* (2013.01); *H01L 21/324* (2013.01)

(58) Field of Classification Search
CPC ......... H01L 21/02164; H01L 21/02052; H01L 21/0228; H01L 21/324
See application file for complete search history.

(56) References Cited

U.S. PATENT DOCUMENTS 5,229,334 A      7/1993   Kato
8,114,776 B2 *   2/2012   Eda .................... H01L 21/31053
                                              438/692
(Continued)

FOREIGN PATENT DOCUMENTS

JP    S52-104870 A    9/1977
JP    H04-018729 A    1/1992
(Continued)

OTHER PUBLICATIONS

Espacenet search results (Year: 2025).*
(Continued)

*Primary Examiner* — Zandra V Smith
*Assistant Examiner* — Andre C Stevenson
(74) *Attorney, Agent, or Firm* — Oliff PLC

(57) ABSTRACT

The present invention is a method for forming a thermal oxide film on a semiconductor substrate, including: a correlation acquisition step of providing a plurality of semiconductor substrates each having a chemical oxide film having a different constitution formed by cleaning, performing a thermal oxidization treatment under identical thermal oxidization treatment conditions to form a thermal oxide film, and determining a correlation between the constitution of the chemical oxide film and a thickness of the thermal oxide film in advance; a cleaning condition determination step of determining the constitution of the chemical oxide film based on the correlation obtained in the correlation acquisition step so that a thickness of a thermal oxide film to be formed on a semiconductor substrate is a predetermined thickness, and determining cleaning conditions for (Continued)

forming a chemical oxide film having the determined constitution of the chemical oxide film; a substrate cleaning step of cleaning the semiconductor substrate under the determined cleaning conditions; and a thermal oxide film formation step of performing a thermal oxidization treatment on the cleaned semiconductor substrate under conditions identical to the thermal oxidization treatment conditions in the correlation acquisition step to form a thermal oxide film on a surface of the semiconductor substrate. Consequently, a thermal oxide film is formed with the target film thickness with excellent reproducibility.

18 Claims, 9 Drawing Sheets

(30) Foreign Application Priority Data

Jun. 25, 2020 (JP) ................................ 2020-109748
Aug. 28, 2020 (JP) ................................ 2020-144443

(56) References Cited

U.S. PATENT DOCUMENTS

2006/0068605 A1* 3/2006 Katsumata ........ H01L 21/02238
438/789
2020/0075789 A1* 3/2020 Löper .................. H10F 71/103

FOREIGN PATENT DOCUMENTS

| JP | H04-113620 A | 4/1992 |
| JP | H04-355921 A | 12/1992 |
| JP | H09-063910 A | 3/1997 |
| JP | 2000-216156 A | 8/2000 |
| JP | 2002-270596 A | 9/2002 |
| JP | 2003-115516 A | 4/2003 |
| JP | 2004-342805 A | 12/2004 |
| JP | 2008-098214 A | 4/2008 |

OTHER PUBLICATIONS

IP17922906IPCOMSearchHistory-20250720.pdf (Year: 2025).*
Shimizu, H. et al., "Kinetics of Ultrathin Thermal Oxide Growth on Si(001) Surfaces," Japanese Journal of Applied Physics, vol. 44, No. 2, 2005, pp. 808-812.
Gould, G. et al., "The Influence of Silicon Surface Cleaning Procedures on Silicon Oxidation," J. Electrochem. Soc., vol. 134, pp. 1031-1033.
Ganem, J. et al., "Chapter 1: Silicon and Silicon Carbide Oxidation" In: "Silicon Technologies: Ion Implantation and Thermal Treatment", 2011, XP093153088.
Apr. 30, 2024 extended Search Report issued in European Patent Application No. 21813565.5.
May 25, 2021 International Search Report issued in International Patent Application No. PCT/JP2021/009514.
Nov. 17, 2022 International Preliminary Report on Patentability issued in International Patent Application No. PCT/JP2021/009514.
T. Takahagi; "Passivation of Si Single-Crystal Surface by Hydrogen Termination"; Journal of the Vacuum Society of Japan; Nov. 1990; vol. 33; No. 11; pp. 854-860.

* cited by examiner

[FIG. 1]
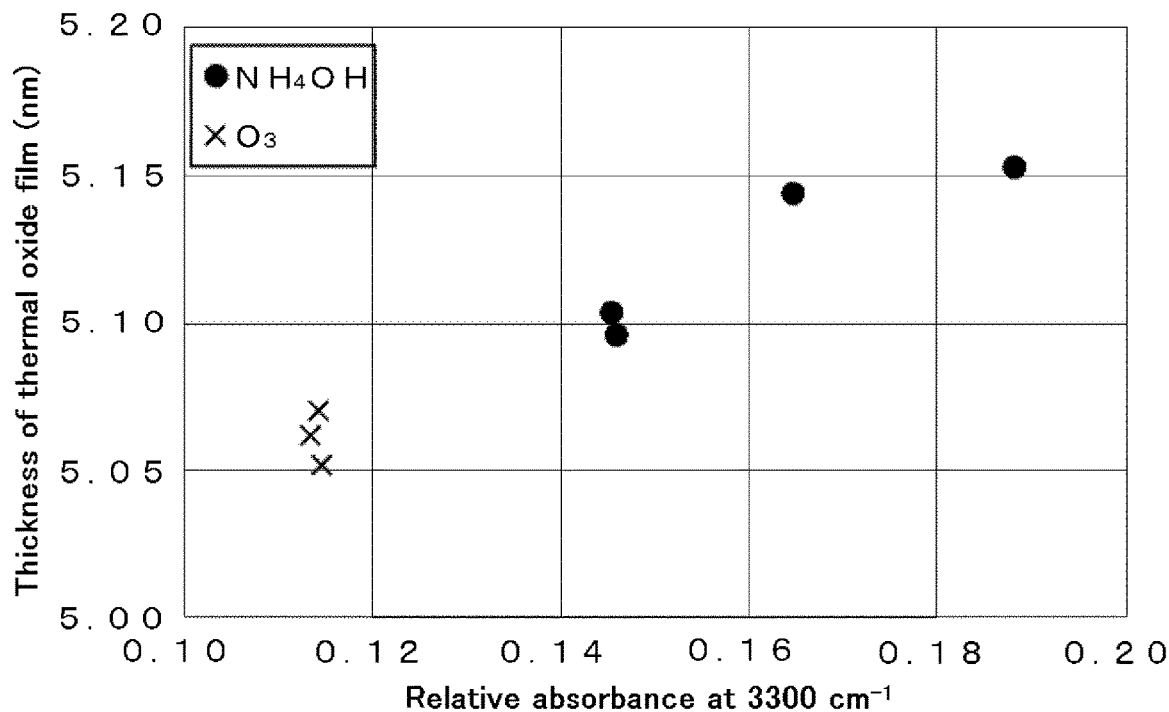
[FIG. 2]
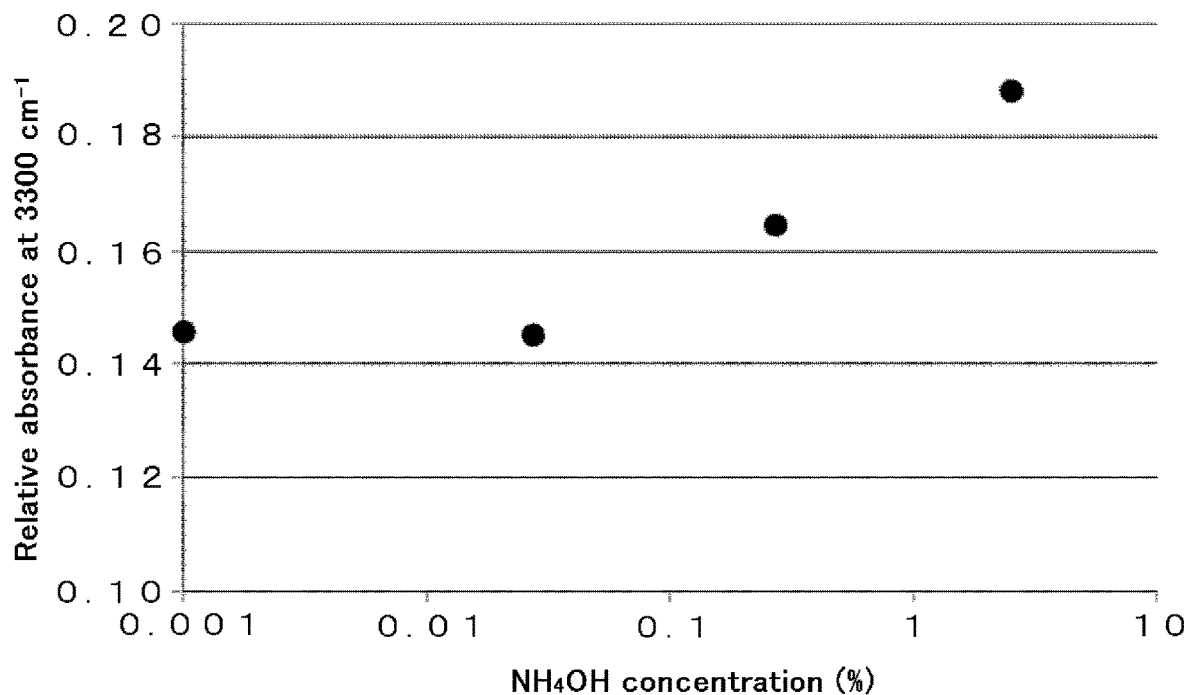

[FIG. 3]
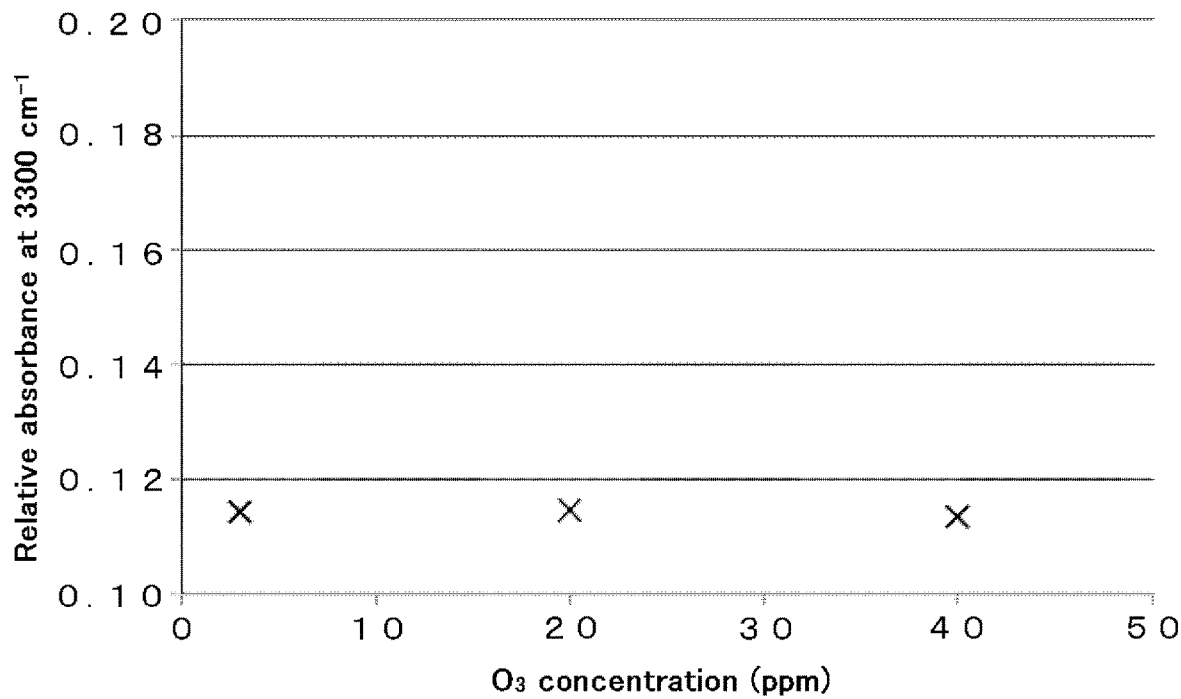
[FIG. 4]
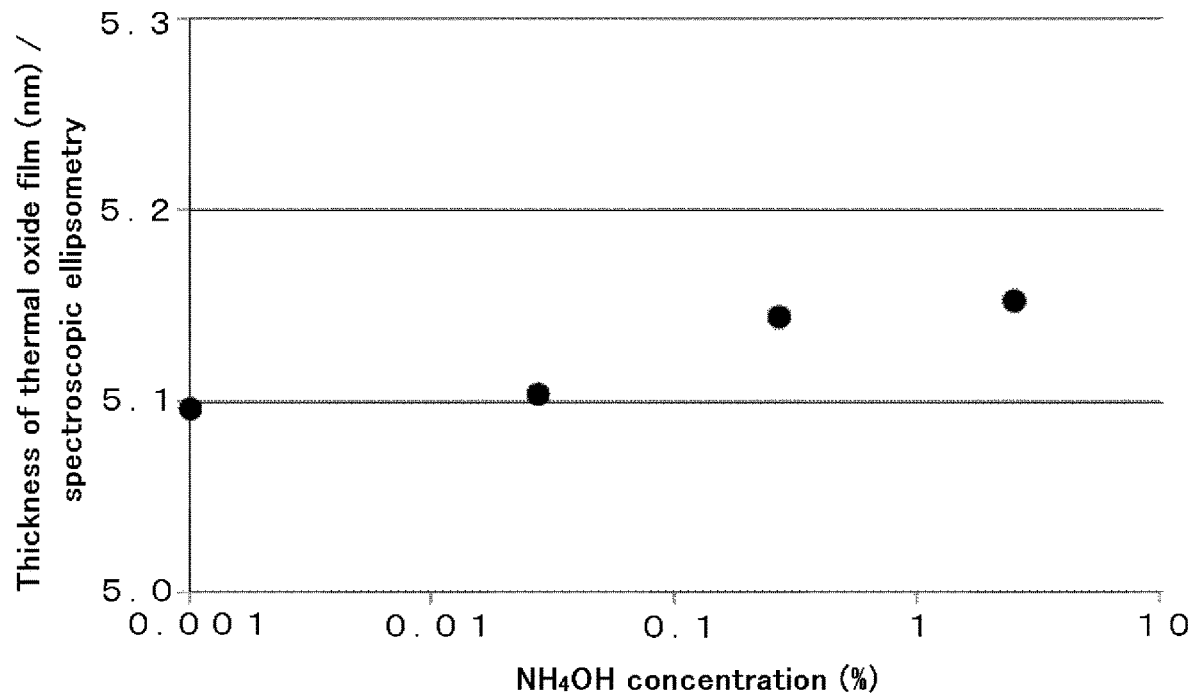

[FIG. 5]
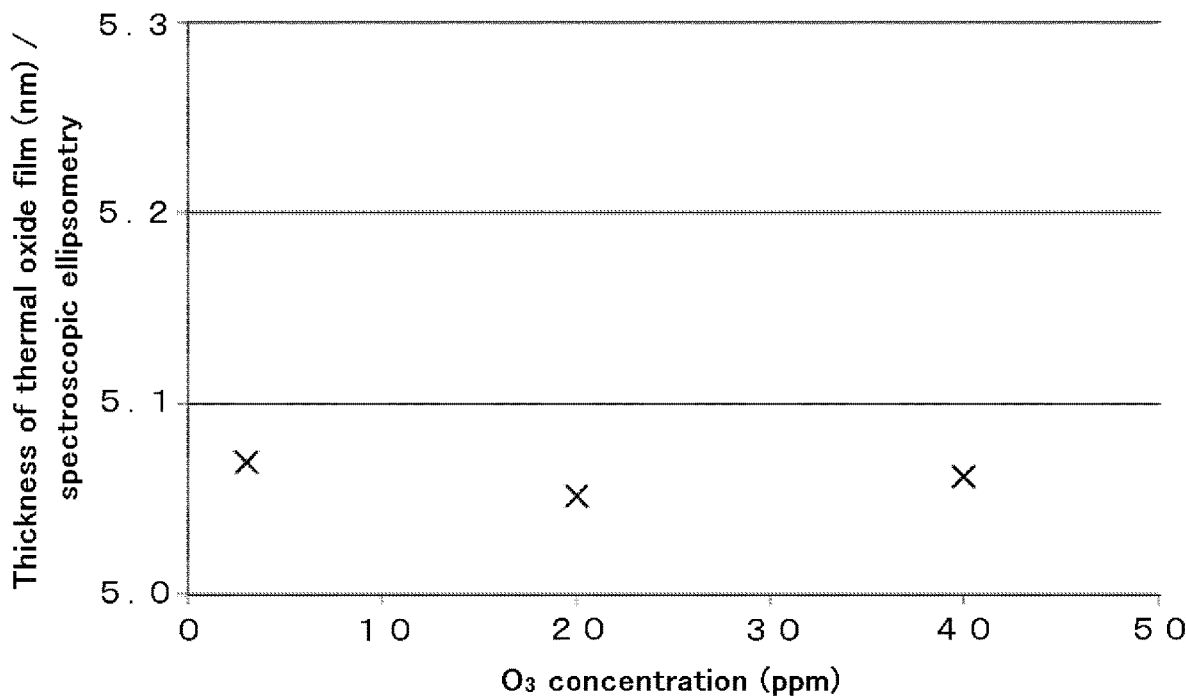
[FIG. 6]
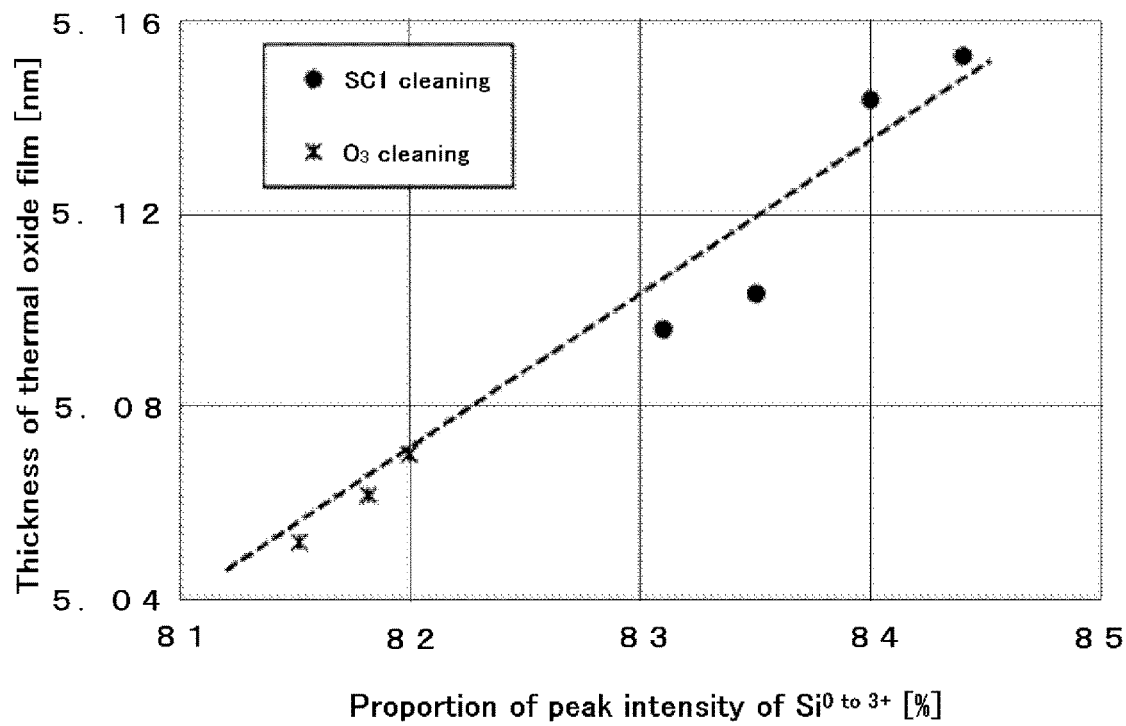

[FIG. 7]
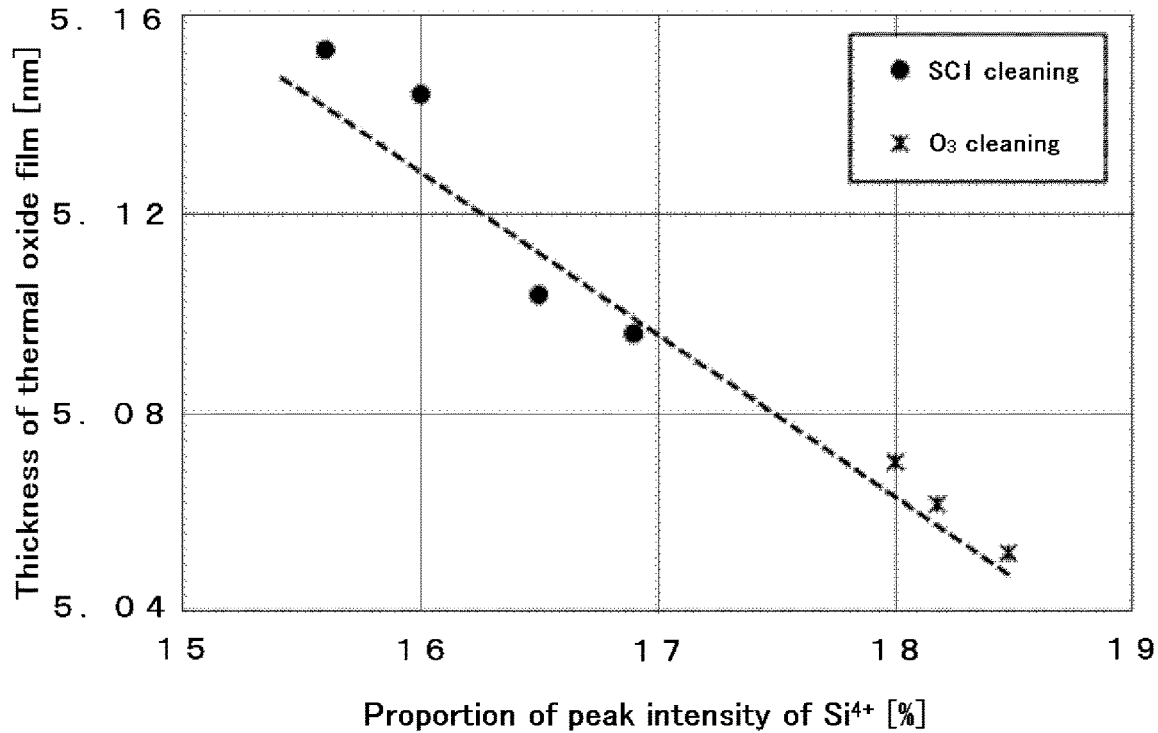
[FIG. 8]
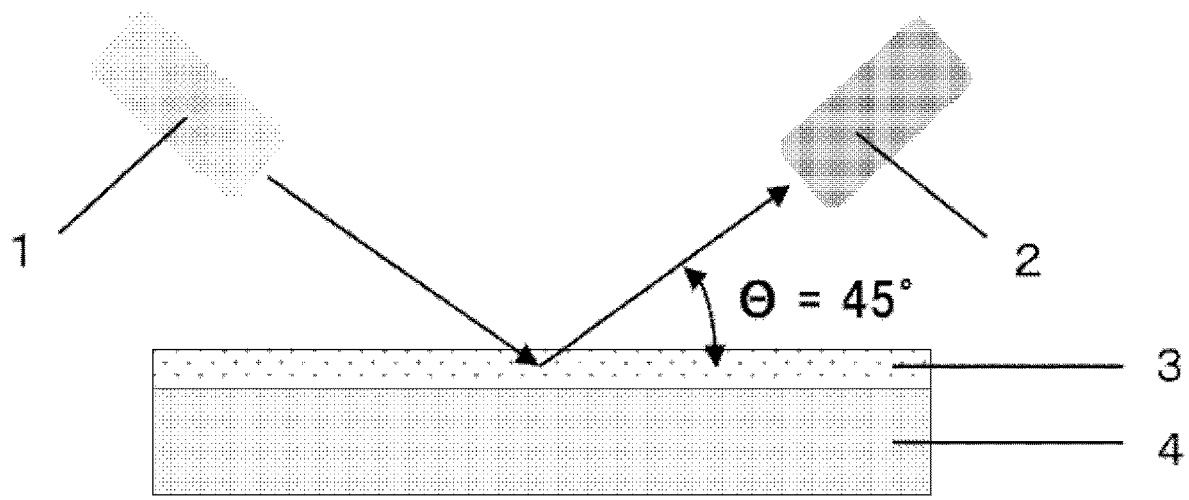

[FIG. 9]
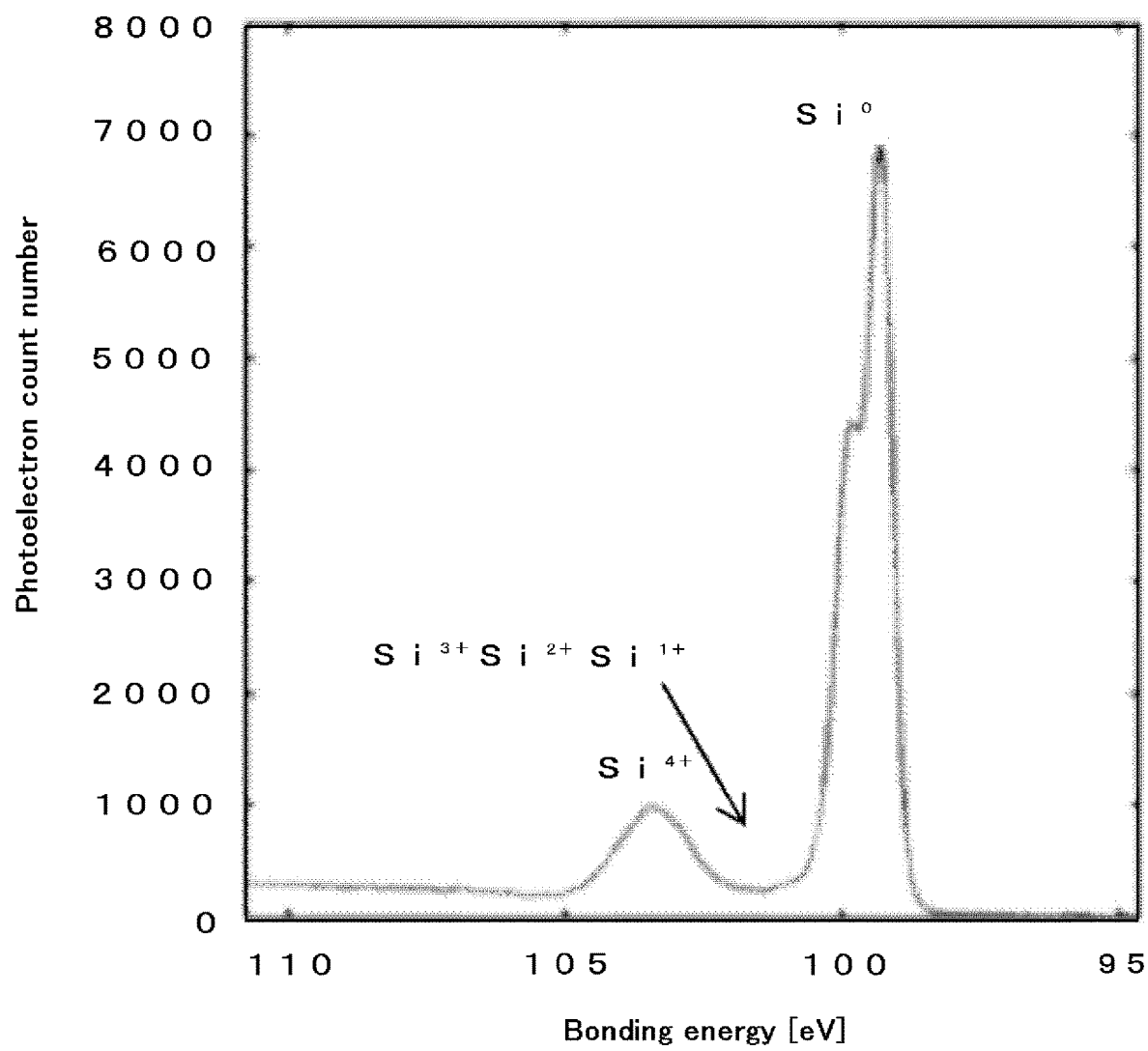

[FIG. 10]
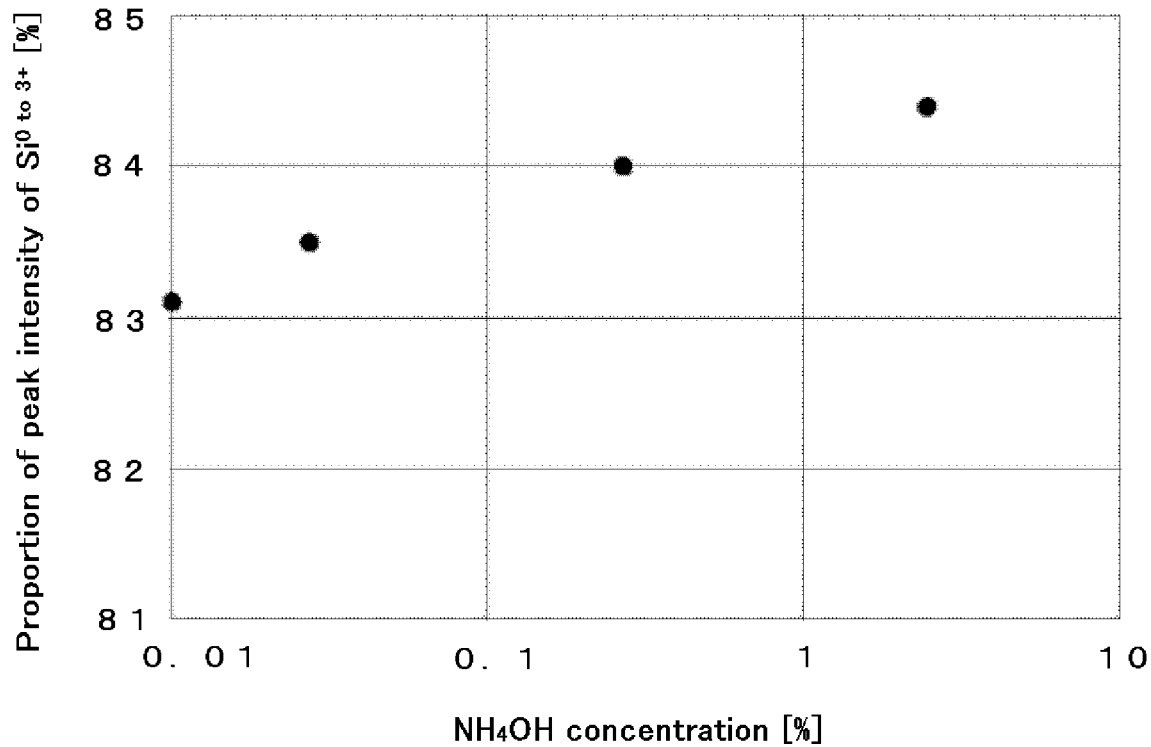
[FIG. 11]
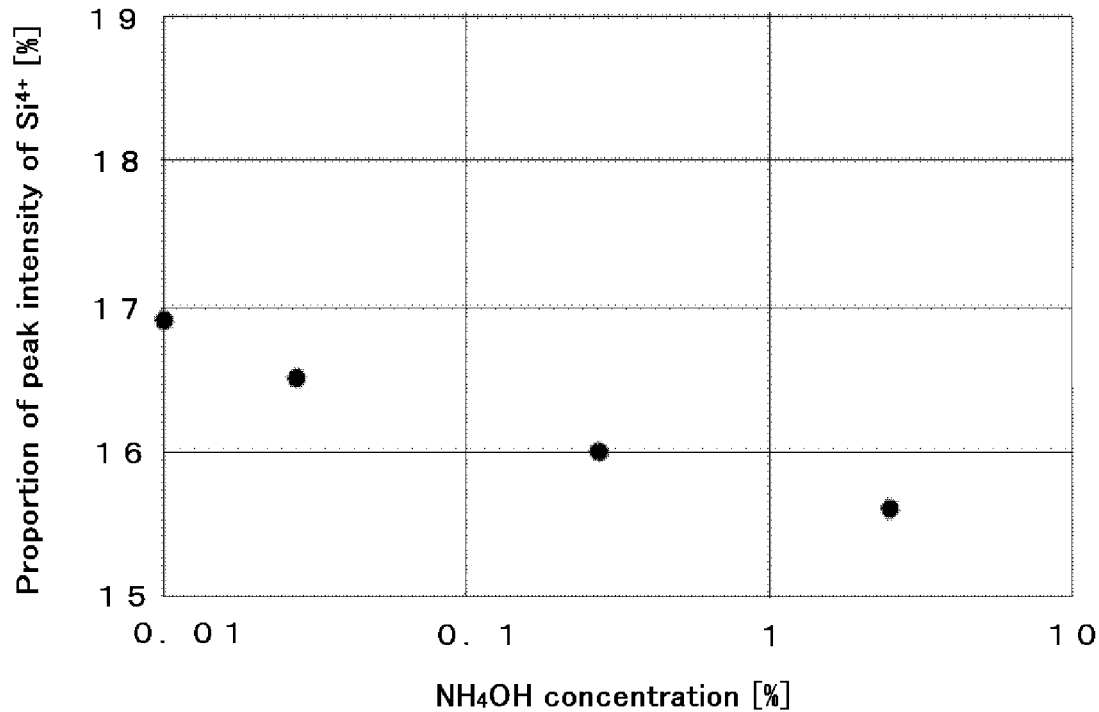

[FIG. 12]
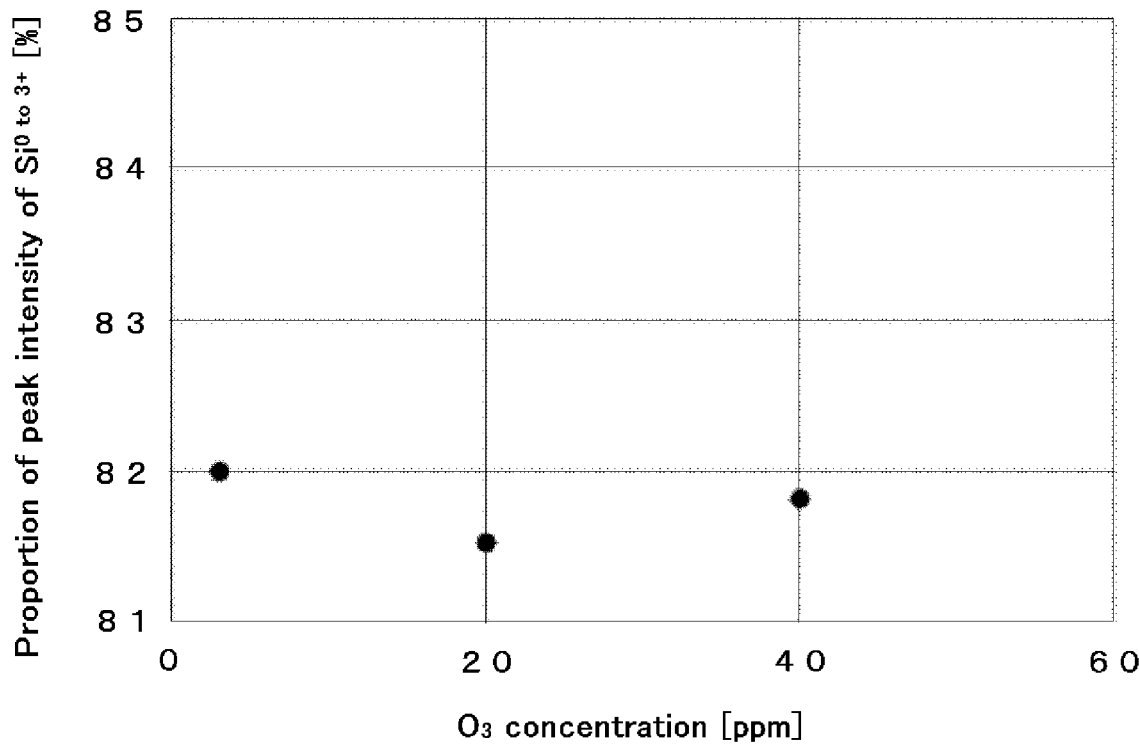
[FIG. 13]
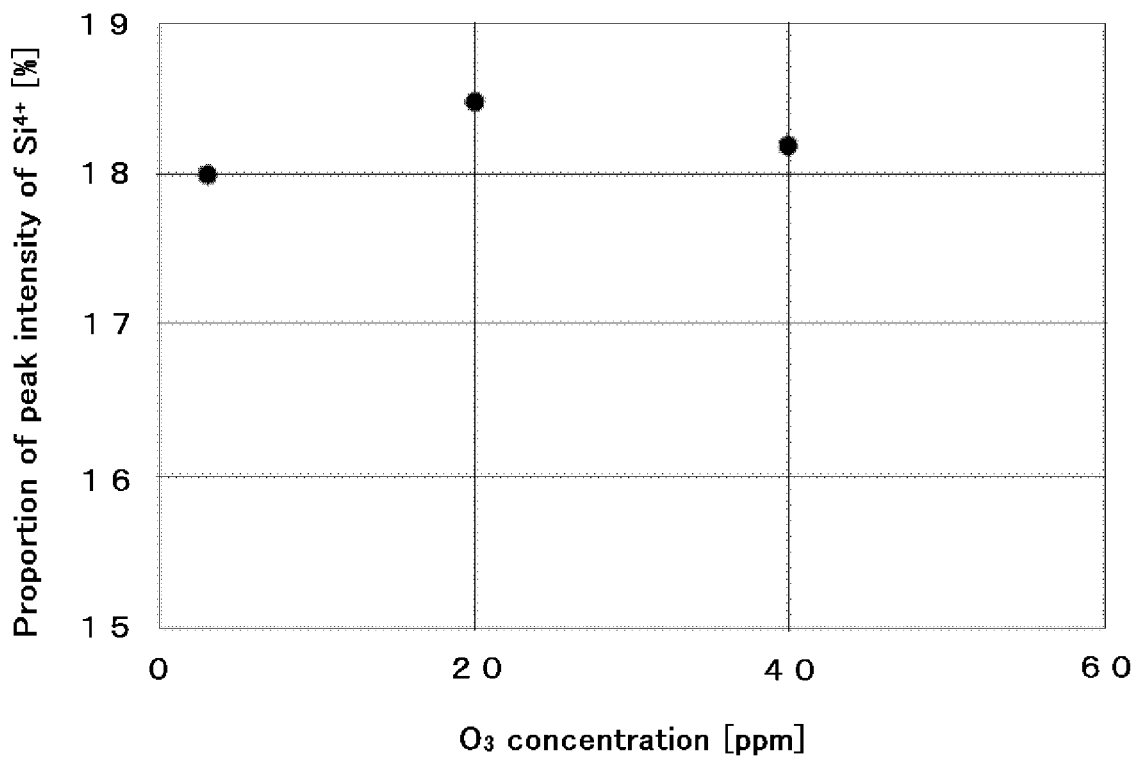

[FIG. 14]
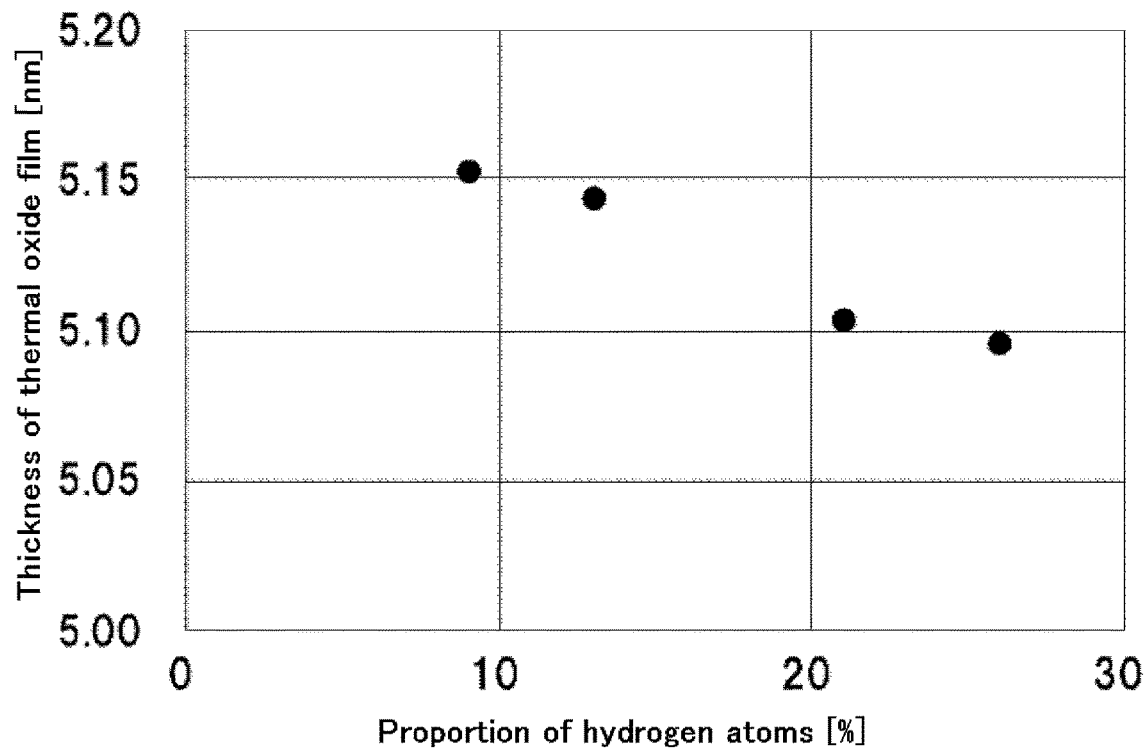
[FIG. 15]
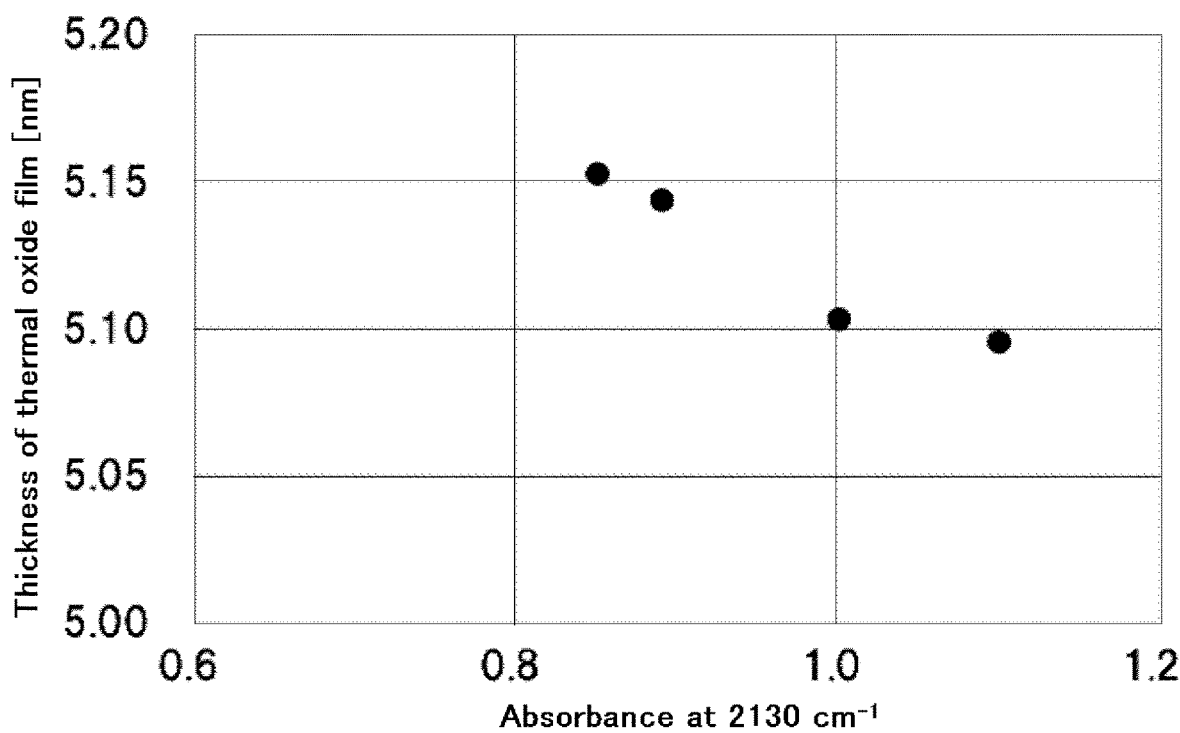

[FIG. 16]
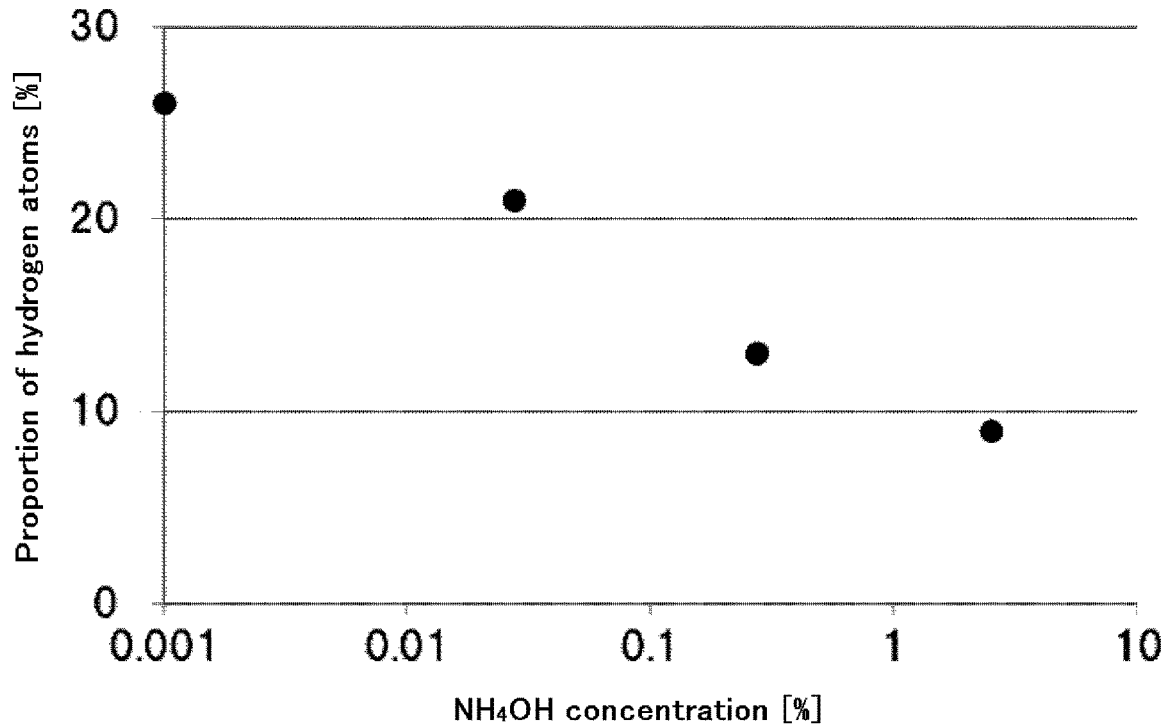
[FIG. 17]
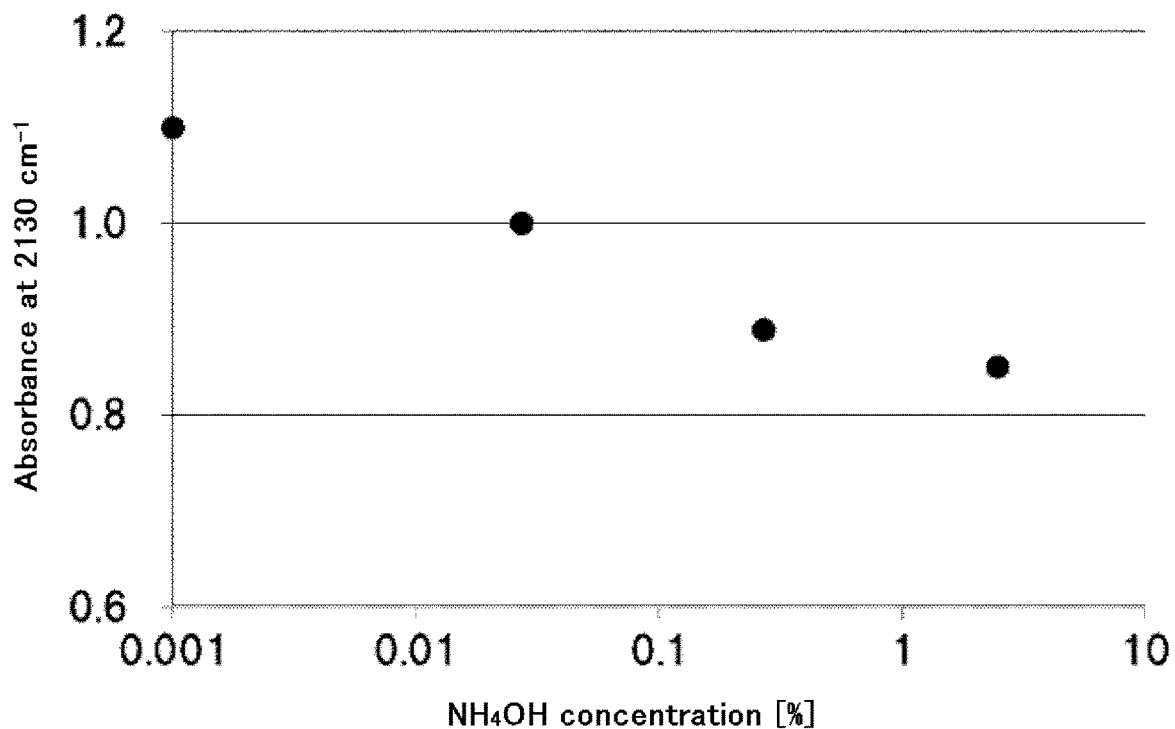

METHOD FOR FORMING THERMAL OXIDE FILM ON SEMICONDUCTOR SUBSTRATE

TECHNICAL FIELD

The present invention relates to: a method for forming a thermal oxide film on a semiconductor substrate.

BACKGROUND ART

Accompanying layer-increasing and thinning of semiconductor integrated circuit devices, various films constituting a device are required to be even thinner. For example, in Patent Document 1, it is stated that when bonding a silicon wafer, the used silicon wafer needs to have a surface having OH groups, and Patent Document 1 discloses cleaning the silicon wafer by using an ordinary SC1 cleaning solution to form a natural oxide film on the surface. Meanwhile, for example, Patent Document 2 discloses, as a method for improving gate characteristics of MOS transistors, a method of cleaning a silicon surface immediately before forming a gate oxide film and performing hydrogen termination and then forming a gate insulator film. Thus, in order to form an extremely thin silicon oxide film that is uniform in the plane or between substrates and with excellent reproducibility, it is now impossible to ignore effects of a natural oxide film or a chemical oxide film (an oxide film formed by a cleaning solution used in a step of cleaning the semiconductor substrate) formed on a semiconductor substrate beforehand.

CITATION LIST

Patent Literature

Patent Document 1: JP H09-063910 A
Patent Document 2: JP 2000-216156 A
Patent Document 3: JP 2003-115516 A
Patent Document 4: JP 2002-270596 A

Non Patent Literature

Non Patent Document 1: Takahagi, Shinkuu, 33(11), 854 (1990)

SUMMARY OF INVENTION

Technical Problem

The present inventors have actually conducted an investigation and research, and it has been discovered that when, for example, a method of cleaning a semiconductor substrate is different, there is a variation in the thickness of the thermal oxide film after the cleaning. It has also be found that this variation in thermal oxide film thickness does not depend on the thickness of the natural oxide film or the thickness of the chemical oxide film before the thermal oxidation. Therefore, it has been difficult to control a thermal oxidation process since the variation in the thickness of the thermal oxide film actually formed cannot be known until the semiconductor substrate is actually subjected to thermal oxidation and the thickness of the thermal oxide film is evaluated.

In Patent Document 3, since OH groups contained in a CVD oxide film (infrared spectroscopy is employed for the evaluation of OH groups in a CVD oxide film) are removed by heating as water, use for calibration and control of moisture meters is proposed. In the case of Patent Document 3, a heat treatment is performed at a low temperature such that OH groups contained in the CVD oxide film are removed as water in advance, and relationships with the growth of a thermal oxide film are not discussed. As described, it is known that OH groups are contained in an oxide film or are a source of water in some cases. However, the CVD oxide film is comparatively thick, and OH groups contained in an oxide film as thin as a natural oxide film and the subsequent growth of a thermal oxide film are not discussed.

Patent Document 4 discloses that it is possible to determine the composition strength of a suboxide of each of $Si^{1+}$, $Si^{2+}$, and $Si^{3+}$ immediately above a silicon substrate from an Si2p spectrum measured by X-ray photoelectron spectroscopy (XPS). However, the object is to determine the interface roughness between silicon and an oxide film, and Patent Document 4 is irrelevant to the technology according to the present invention, where the thickness of a thermal oxide film is controlled when performing an oxidation heat treatment.

The present invention has been made to solve the above problems, and an object thereof is to provide a method for forming a thermal oxide film on a semiconductor substrate by which it is possible to form a thermal oxide film with the thin target thickness and with excellent reproducibility.

Solution to Problem

The present invention has been made to achieve the object, and provides a method for forming a thermal oxide film on a semiconductor substrate, comprising:
  a correlation acquisition step of providing a plurality of semiconductor substrates each having a chemical oxide film formed by cleaning, each chemical oxide film having a different constitution, subjecting the plurality of semiconductor substrates to a thermal oxidization treatment under identical thermal oxidization treatment conditions to form a thermal oxide film, and determining a correlation between the constitution of the chemical oxide film and a thickness of the thermal oxide film in advance;
  a cleaning condition determination step of determining the constitution of the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined constitution of the chemical oxide film;
  a substrate cleaning step of cleaning the semiconductor substrate under the cleaning conditions determined in the cleaning condition determination step; and
  a thermal oxide film formation step of performing a thermal oxidization treatment on the semiconductor substrate cleaned in the substrate cleaning step under conditions identical to the thermal oxidization treatment conditions in the correlation acquisition step to form a thermal oxide film on a surface of the semiconductor substrate.

According to such a method for forming a thermal oxide film on a semiconductor substrate, a thermal oxide film can be formed with the thin target thickness with excellent reproducibility. As a result, control of a thermal oxidation process is facilitated.

The present invention has been made to achieve the object, and provides a method for forming a thermal oxide film on a semiconductor substrate, comprising:

a correlation acquisition step of providing a plurality of semiconductor substrates each having a chemical oxide film formed by cleaning, each chemical oxide film having a different amount of OH groups contained in the chemical oxide film, subjecting the plurality of semiconductor substrates to a thermal oxidization treatment under identical thermal oxidization treatment conditions to form a thermal oxide film, and determining a correlation between the amount of OH groups in the chemical oxide film and a thickness of the thermal oxide film in advance;

a cleaning condition determination step of determining the amount of OH groups in the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined amount of OH groups;

a substrate cleaning step of cleaning the semiconductor substrate under the cleaning conditions determined in the cleaning condition determination step; and a thermal oxide film formation step of performing a thermal oxidization treatment on the semiconductor substrate cleaned in the substrate cleaning step under conditions identical to the thermal oxidization treatment conditions in the correlation acquisition step to form a thermal oxide film on a surface of the semiconductor substrate.

According to such a method for forming a thermal oxide film on a semiconductor substrate, a thin oxide film with a predetermined thickness can be formed with excellent reproducibility. As a result, control of a thermal oxidization process is facilitated.

In this event, the amount of OH groups is preferably obtained by performing an ATR-FT-IR measurement of the chemical oxide film by using a prism for measuring ATR and is preferably calculated from absorbance of OH groups around 3300 $cm^{-1}$.

ATR-FT-IR has higher sensitivity to OH groups present in the surface compared with common transmission FT-IR, and therefore, the evaluation of the amount of OH groups can be performed with higher accuracy.

The present invention preferably further comprises, after the substrate cleaning step and before the thermal oxide film formation step, an OH-group-amount measurement step of measuring an amount of OH groups contained in a chemical oxide film formed on the semiconductor substrate by the cleaning performed in the substrate cleaning step.

When the amount of OH groups contained in the chemical oxide film is measured between the substrate cleaning step and the thermal oxide film formation step in this manner, the thermal oxide film can be formed with even more excellent reproducibility.

The present invention has been made to achieve the object, and provides a method for forming a thermal oxide film on a semiconductor substrate, comprising:

a correlation acquisition step of providing a plurality of semiconductor substrates each having a chemical oxide film formed by cleaning, each chemical oxide film having different stoichiometric proportions of constituent elements of the chemical oxide film, subjecting the plurality of semiconductor substrates to a thermal oxidization treatment under identical thermal oxidization treatment conditions to form a thermal oxide film, and determining a correlation between the stoichiometric proportions of the constituent elements of the chemical oxide film and a thickness of the thermal oxide film in advance;

a cleaning condition determination step of determining the stoichiometric proportions of the constituent elements of the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined stoichiometric proportions;

a substrate cleaning step of cleaning the semiconductor substrate under the cleaning conditions determined in the cleaning condition determination step; and a thermal oxide film formation step of performing a thermal oxidization treatment on the semiconductor substrate cleaned in the substrate cleaning step under conditions identical to the thermal oxidization treatment conditions in the correlation acquisition step to form a thermal oxide film on a surface of the semiconductor substrate.

According to such a method for forming a thermal oxide film on a semiconductor substrate, a thermal oxide film can be formed with the thin target thickness with excellent reproducibility. As a result, control of a thermal oxidization process is facilitated.

In this event, regarding the stoichiometric proportions of the constituent elements of the chemical oxide film, out of the constituent elements of the chemical oxide film, a peak intensity of a bonding energy in a state where substrate atoms of the semiconductor substrate are not bonded to oxygen atoms and a state where the substrate atoms are bonded to oxygen atoms to form a suboxide and a peak intensity of a bonding energy in a state where the substrate atoms are completely bonded to oxygen atoms can be respectively measured using XPS, and the stoichiometric proportions can be defined as proportions of the measured peak intensities.

The XPS method is a method by which the information of the outermost surface layer of the semiconductor substrate can be evaluated simply and with high precision. In this manner, the thermal oxide film can be formed with the thin target thickness with more excellent reproducibility.

The present invention has been made to achieve the object, and provides a method for forming a thermal oxide film on a semiconductor substrate, comprising:

a correlation acquisition step of providing a plurality of semiconductor substrates each having a chemical oxide film formed by cleaning, each chemical oxide film having a different amount of hydrogen atoms contained in the chemical oxide film, subjecting the plurality of semiconductor substrates to a thermal oxidization treatment under identical thermal oxidization treatment conditions to form a thermal oxide film, and determining a correlation between the amount of hydrogen atoms in the chemical oxide film and a thickness of the thermal oxide film in advance;

a cleaning condition determination step of determining the amount of hydrogen atoms in the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined amount of hydrogen atoms;

a substrate cleaning step of cleaning the semiconductor substrate under the cleaning conditions determined in the cleaning condition determination step; and a thermal oxide film formation step of performing a thermal oxidation treatment on the semiconductor substrate cleaned in the substrate cleaning step under conditions identical to the thermal oxidation treatment conditions in the correlation acquisition step to form a thermal oxide film on a surface of the semiconductor substrate.

According to such a method for forming a thermal oxide film on a semiconductor substrate, a thermal oxide film can be formed with the thin target thickness with excellent reproducibility. As a result, control of a thermal oxidation process is facilitated.

In this event, the semiconductor substrate can be a silicon wafer and the thermal oxide film can be a silicon oxide film.

The inventive method for forming a thermal oxide film on a semiconductor substrate is particularly suitable for a silicon oxide film formed on a silicon substrate.

In this event, the amount of hydrogen atoms can be obtained by performing an RBS measurement of the chemical oxide film and can be calculated from a determined proportion of hydrogen atoms in the chemical oxide film.

According to such a measuring method, the amount of hydrogen atoms can be evaluated with higher accuracy.

In this event, the amount of hydrogen atoms can be obtained by performing an ATR-FT-IR measurement of the chemical oxide film by using a prism for measuring ATR and can be calculated from absorbance of $SiH_3$ groups around 2130 $cm^{-1}$.

ATR-FT-IR has higher sensitivity to hydrogen atoms present in a chemical oxide film than common transmission FT-IR, and therefore, the amount of hydrogen atoms can be evaluated with higher accuracy.

In this event, the present invention can further comprise, after the substrate cleaning step and before the thermal oxide film formation step, a hydrogen-atom-amount measurement step of measuring an amount of hydrogen atoms contained in a chemical oxide film formed on the semiconductor substrate by the cleaning performed in the substrate cleaning step.

When the amount of hydrogen atoms contained in the chemical oxide film is measured between the substrate cleaning step and the thermal oxide film formation step in this manner, the thermal oxide film can be formed with further excellent reproducibility.

In this event, the predetermined thickness can be 1 to 10 nm.

When the thickness of the thermal oxide film to be formed is in such a range, a thin thermal oxide film having a constant thickness can be formed with more excellent reproducibility.

Advantageous Effects of Invention

As described above, according to the inventive method for forming a thermal oxide film on a semiconductor substrate, a thermal oxide film can be formed with the thin target thickness with excellent reproducibility. As a result, control of a thermal oxidation process is facilitated.

BRIEF DESCRIPTION OF DRAWINGS

FIG. 1 is a graph showing the relationship between the amount of OH groups (relative absorbance at 3300 $cm^{-1}$) and the thickness of a thermal oxide film.

FIG. 2 is a graph showing the relationship between the concentration of $NH_4OH$ and the amount of OH groups (relative absorbance at 3300 $cm^{-1}$).

FIG. 3 is a graph showing the relationship between the concentration of $O_3$ and the amount of OH groups (relative absorbance at 3300 $cm^{-1}$).

FIG. 4 is a graph showing the relationship between the concentration of $NH_4OH$ and the thickness of a thermal oxide film.

FIG. 5 is a graph showing the relationship between the concentration of $O_3$ and the thickness of a thermal oxide film.

FIG. 6 is a graph showing the relationship between the proportion of the peak intensity of $Si^{0\ to\ 3+}$ and the thickness of a thermal oxide film.

FIG. 7 is a graph showing the relationship between the proportion of the peak intensity of $Si^{4+}$ and the thickness of a thermal oxide film.

FIG. 8 is a diagram showing an example of X-ray photoelectron spectroscopy (XPS) measurement.

FIG. 9 is a graph showing an example of an XPS spectrum of a sample having a silicon oxide film on a silicon substrate.

FIG. 10 is a graph showing the relationship between the concentration of $NH_4OH$ and the proportion of the peak intensity of $Si^{0\ to\ 3+}$.

FIG. 11 is a graph showing the relationship between the concentration of $NH_4OH$ and the proportion of the peak intensity of $Si^{4+}$.

FIG. 12 is a graph showing the relationship between the concentration of $O_3$ and the proportion of the peak intensity of $Si^{0\ to\ 3+}$.

FIG. 13 is a graph showing the relationship between the concentration of $O_3$ and the proportion of the peak intensity of $Si^{4+}$.

FIG. 14 is a graph showing the relationship between the amount of hydrogen atoms (proportion of hydrogen atoms in a chemical oxide film) obtained by RBS measurement and the thickness of a thermal oxide film.

FIG. 15 is a graph showing the relationship between the amount of hydrogen atoms (absorbance at 2130 $cm^{-1}$) obtained by ATR-FT-IR measurement and the thickness of a thermal oxide film.

FIG. 16 is a graph showing the relationship between the concentration of $NH_4OH$ and the amount of hydrogen atoms (proportion of hydrogen atoms in a chemical oxide film: RBS measurement).

FIG. 17 is a graph showing the relationship between the concentration of $NH_4OH$ and the amount of hydrogen atoms (absorbance at 2130 $cm^{-1}$: ATR-FT-IR measurement).

DESCRIPTION OF EMBODIMENTS

Hereinafter, the present invention will be described in detail, but the present invention is not limited thereto.

As described above, there has been required a method for forming a thermal oxide film on a semiconductor substrate by which it is possible to form a thermal oxide film with an intended thin thickness with excellent reproducibility.

The present inventors have earnestly studied the problem and found out that a thermal oxide film can be formed to have a thin target thickness with excellent reproducibility by the following method, and that as a result, control of a thermal oxidation process is facilitated, the method being a method for forming a thermal oxide film on a semiconductor substrate, comprising:

a correlation acquisition step of providing a plurality of semiconductor substrates each having a chemical oxide film formed by cleaning, each chemical oxide film having a different constitution, subjecting the plurality of semiconductor substrates to a thermal oxidation treatment under identical thermal oxidation treatment conditions to form a thermal oxide film, and determining a correlation between the constitution of the chemical oxide film and a thickness of the thermal oxide film in advance;

a cleaning condition determination step of determining the constitution of the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined constitution of the chemical oxide film;

a substrate cleaning step of cleaning the semiconductor substrate under the cleaning conditions determined in the cleaning condition determination step; and a thermal oxide film formation step of performing a thermal oxidation treatment on the semiconductor substrate cleaned in the substrate cleaning step under conditions identical to the thermal oxidation treatment conditions in the correlation acquisition step to form a thermal oxide film on a surface of the semiconductor substrate. Thus, the present inventors have completed the present invention.

The present inventors have earnestly studied the problem and found out that according to the following method, it is possible to form a thin thermal oxide film with a constant thickness with excellent reproducibility, and that as a result, control of a thermal oxidation process is facilitated, the method being a method for forming a thermal oxide film on a semiconductor substrate, comprising:

a correlation acquisition step of providing a plurality of semiconductor substrates each having a chemical oxide film formed by cleaning, each chemical oxide film having a different amount of OH groups contained in the chemical oxide film, subjecting the plurality of semiconductor substrates to a thermal oxidation treatment under identical thermal oxidation treatment conditions to form a thermal oxide film, and determining a correlation between the amount of OH groups in the chemical oxide film and a thickness of the thermal oxide film in advance;

a cleaning condition determination step of determining the amount of OH groups in the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined amount of OH groups;

a substrate cleaning step of cleaning the semiconductor substrate under the cleaning conditions determined in the cleaning condition determination step; and a thermal oxide film formation step of performing a thermal oxidation treatment on the semiconductor substrate cleaned in the substrate cleaning step under conditions identical to the thermal oxidation treatment conditions in the correlation acquisition step to form a thermal oxide film on a surface of the semiconductor substrate. Thus, the present invention has been completed.

The present inventors have earnestly studied the problem and found out that according to the following method, a thermal oxide film can be formed with the thin target thickness with excellent reproducibility and that as a result, control of a thermal oxidation process is facilitated, the method being a method for forming a thermal oxide film on a semiconductor substrate, comprising:

a correlation acquisition step of providing a plurality of semiconductor substrates each having a chemical oxide film formed by cleaning, each chemical oxide film having different stoichiometric proportions of constituent elements of the chemical oxide film, subjecting the plurality of semiconductor substrates to a thermal oxidation treatment under identical thermal oxidation treatment conditions to form a thermal oxide film, and determining a correlation between the stoichiometric proportions of the constituent elements of the chemical oxide film and a thickness of the thermal oxide film in advance;

a cleaning condition determination step of determining the stoichiometric proportions of the constituent elements of the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined stoichiometric proportions;

a substrate cleaning step of cleaning the semiconductor substrate under the cleaning conditions determined in the cleaning condition determination step; and a thermal oxide film formation step of performing a thermal oxidation treatment on the semiconductor substrate cleaned in the substrate cleaning step under conditions identical to the thermal oxidation treatment conditions in the correlation acquisition step to form a thermal oxide film on a surface of the semiconductor substrate. Thus, the present invention has been completed.

The present inventors have earnestly studied the problem and found out that according to the following method, a thermal oxide film can be formed with the thin target thickness with excellent reproducibility and that as a result, control of a thermal oxidation process is facilitated, the method being a method for forming a thermal oxide film on a semiconductor substrate, comprising:

a correlation acquisition step of providing a plurality of semiconductor substrates each having a chemical oxide film formed by cleaning, each chemical oxide film having a different amount of hydrogen atoms contained in the chemical oxide film, subjecting the plurality of semiconductor substrates to a thermal oxidation treatment under identical thermal oxidation treatment conditions to form a thermal oxide film, and determining a correlation between the amount of hydrogen atoms in the chemical oxide film and a thickness of the thermal oxide film in advance;

a cleaning condition determination step of determining the amount of hydrogen atoms in the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined amount of hydrogen atoms;

a substrate cleaning step of cleaning the semiconductor substrate under the cleaning conditions determined in the cleaning condition determination step; and a thermal oxide film formation step of performing a thermal oxidization treatment on the semiconductor substrate cleaned in the substrate cleaning step under conditions identical to the thermal oxidization treatment conditions in the correlation acquisition step to form a thermal oxide film on a surface of the semiconductor substrate. Thus, the present invention has been completed.

Hereinafter, a description will be given with reference to the figures.

The present inventors have earnestly investigated the fact that variation occurs in the thickness of the formed thermal oxide film when the method of cleaning the semiconductor substrate is different, and found out that the constitution of the chemical oxide film formed by cleaning the semiconductor substrate has a great influence on thermal oxidization treatment. Thus, the present inventors have completed a thermal oxidization method that makes it possible to form a thin thermal oxide film having a predetermined thickness with excellent reproducibility by making use of this phenomenon.

For example, when the semiconductor substrate is a silicon wafer, the chemical oxide film is a silicon oxide film, and can be represented by $SiO_x$ ($0 < x \leq 2$). Elements related to the constitution of the chemical oxide film are, as results of various analyses, silicon, oxygen, and hydrogen. Here, the "x" in the $SiO_x$ of the chemical oxide film will be referred to as oxygen proportion. The oxidization property of the thermal oxide film to be formed is affected by the oxygen proportion (x) of the chemical oxide film and silicon interface, and the formation rate of the thermal oxide film changes. Fluctuation of the oxygen proportion means that elements other than oxygen are present at different proportions.

Hydrogen is present in the form of Si—H or Si—OH. That is, if these Hs increase, the proportion of oxygen present is affected, and decreases. The proportion of H is small compared with other constituent elements, oxygen and silicon. However, by terminating the silicon in the form of Si—H or being present as a back bond of silicon, H has an effect on the bonding state of silicon. In addition, H exists as a functional group as in an OH group, and has an important role of determining reactivity.

Meanwhile, silicon and oxygen, which are main constituent elements, have a different bonding ratio to $SiO_2$, and are called suboxide. Suboxide has a function as a precursor of a silicon oxide film, and is an important constituent that determines the properties of the thermal oxide film to be formed. In this manner, by focusing on the proportion of oxygen in the chemical oxide film and obtaining the correlation between the constitution of the chemical oxide film and the thickness of the thermal oxide film, the thickness of the thermal oxide film can be controlled.

In the present invention, it is sufficient for the semiconductor substrates provided for obtaining the correlation to have a chemical oxide film having a different constitution, and the constitution includes the amount of OH groups, the stoichiometric proportions of the constituent elements, and the amount of hydrogen atoms.

Note that in the present description, the oxide film formed by cleaning the semiconductor substrate is defined as a chemical oxide film. Here, the method and conditions of the cleaning are not particularly limited. Oxide films formed by cleaning using a chemical solution, cleaning with pure water, etc. are included.

Specific embodiments of the present invention will be described.

First Embodiment

In a method for forming a thermal oxide film on a semiconductor substrate according to the first embodiment of the present invention, the constitution of a chemical oxide film formed on a surface of a cleaned semiconductor substrate is assessed in advance before the thermal oxidization treatment of the semiconductor substrate. The correlation between the constitution of the chemical oxide film and the thickness of a thermal oxide film when the semiconductor substrate has been subjected to thermal oxidization is determined. Thus, the constitution of the chemical oxide film on a surface of a semiconductor substrate on which a thermal oxide film is to be formed is determined so that the thickness of the thermal oxide film to be formed on the semiconductor substrate will be a predetermined thickness. The cleaning conditions are adjusted so as to achieve the determined constitution of the chemical oxide film, and a chemical oxide film is formed. In this manner, it is possible to form a thin thermal oxide film of a predetermined thickness with excellent reproducibility.

The present inventors have earnestly investigated the fact that variation occurs in the thickness of the formed thermal oxide film when the method of cleaning the semiconductor substrate is different, and found out that the constitution of the chemical oxide film formed by cleaning the semiconductor substrate has a great influence on thermal oxidization treatment. Thus, the present inventors have completed a thermal oxidization method that makes it possible to form a thin thermal oxide film having a predetermined thickness with excellent reproducibility by making use of this phenomenon.

The method for forming a thermal oxide film on a semiconductor substrate according to the first embodiment of the present invention will be described.

(Correlation Acquisition Step)

Firstly, a plurality of semiconductor substrates are prepared. Silicon wafers are preferably used as the semiconductor substrates. In this case, the thermal oxide film to be formed is a silicon oxide film. Silicon wafers are widely used as semiconductor substrates, and particularly in a device production process, a thermal oxide film is sometimes formed. Therefore, a more accurate evaluation can be performed by forming a thermal oxide film and evaluating the silicon wafer itself.

Firstly, in order to achieve a state where the prepared semiconductor substrates do not have an oxide film on the surface, the semiconductor substrates are preferably cleaned with HF (hydrofluoric acid). Cleaning is further carried out after removing the oxide film by cleaning with HF. Methods for performing the cleaning after the HF cleaning are not particularly limited. For example, cleaning using a chemical solution such as SC1 cleaning and $O_3$ cleaning can be performed, or cleaning such as pure water rinsing can also be performed. A chemical oxide film is formed on the plurality of prepared semiconductor substrates by the cleaning performed after the HF cleaning. In this event, measures are taken so that the constitutions of the respective chemical oxide films of the plurality of semiconductor substrates are different. When the cleaning is performed by a method using a chemical solution, it is possible to achieve semiconductor substrates having chemical oxide films with different constitutions simply. Therefore, this method is preferable. Since the cleaning treatment is for obtaining the correlation, the cleaning is preferably performed employing as many different kinds of cleaning and/or under as many different cleaning conditions as possible. On obtaining a correlation, it is preferable to perform cleaning employing as many different kinds of cleaning and/or under as many different cleaning conditions as possible and obtain a correlation between a plurality of cleaning conditions and constitutions of a chemical oxide film.

Next, the constitution of the chemical oxide film formed by the cleaning is assessed. In this event, as long as the difference in the constitutions of the chemical oxide films can be made clear, the assessment is not particularly limited.

Next, the plurality of semiconductor substrates each having a chemical oxide film with a different constitution are subjected to a thermal oxidization treatment under identical thermal oxidization treatment conditions to form a thermal oxide film. The formation conditions of the thermal oxide film are not particularly limited, and the formation can be performed by an ordinary method. Then, the thickness of the formed thermal oxide film is measured. The measurement can be performed, for example, by spectroscopic ellipsometry or the like.

The correlation between the constitution of the chemical oxide film thus determined and the thickness of the formed thermal oxide film is determined.

Note that the assessment of the constitution of the chemical oxide film and the measurement of the thickness of the thermal oxide film can also be carried out by using a monitor wafer or the like that has been subjected to the same cleaning treatment and thermal oxidization treatment as the semiconductor substrate on which a thermal oxide film is to be formed, or by extracting some semiconductor substrates that have been subjected to the same treatments.

(Cleaning Condition Determination Step)

Cleaning conditions are determined, such that the thickness of the thermal oxide film to be formed on a surface of a semiconductor substrate is a predetermined thickness. On the basis of the correlation obtained in the correlation acquisition step, the constitution of the chemical oxide film at which a thermal oxide film having a predetermined thickness is formed is determined, and in the meantime, cleaning conditions for forming a chemical oxide film so as to achieve the determined constitution of the chemical oxide film are determined. In the determination of the cleaning conditions, a correlation between the cleaning conditions and the constitution of the chemical oxide film can be obtained in advance, and this correlation can be used, for example.

(Substrate Cleaning Step)

Next, a semiconductor substrate on which a thermal oxide film is to be actually formed is newly prepared, and cleaning is performed under the cleaning conditions determined in the cleaning condition determination step.

(Thermal Oxide Film Formation Step)

A thermal oxidization treatment is performed under the same conditions as in the thermal oxidization treatment performed in the correlation acquisition step to form a thermal oxide film on a surface of the semiconductor substrate cleaned in the substrate cleaning step.

By forming a thermal oxide film on the semiconductor substrate through the steps according to the present invention as described above, it is possible to form a thin thermal oxide film of a predetermined thickness with excellent reproducibility.

Note that in the present invention, a more remarkable effect can be achieved when the thickness of the thermal oxide film to be formed on the semiconductor substrate surface is thin and in the range of 1 to 10 nm. Therefore, the present invention is suitable for forming a thermal oxide film in such a range.

Second Embodiment

In a method for forming a thermal oxide film on a semiconductor substrate according to the second embodiment of the present invention, focusing on the difference in the amount of OH groups contained in the chemical oxide film, the correlation between the amount of OH groups in the chemical oxide film formed on the surface of the cleaned semiconductor substrate and the thickness of the thermal oxide film when the semiconductor substrate has been subjected to thermal oxidization is determined in advance before the thermal oxidization treatment of the semiconductor substrate. The amount of OH groups in the chemical oxide film is determined so that the thickness of the thermal oxide film to be formed on the semiconductor substrate is a predetermined thickness, and a chemical oxide film that has the determined amount of OH groups is formed. In this manner, it is possible to form an oxide film having a predetermined thickness with excellent reproducibility.

The present inventors have earnestly investigated the fact that variation occurs in the thickness of the formed thermal oxide film when the method of cleaning the semiconductor substrate is different, and found out that the amount of OH groups in the chemical oxide film formed by cleaning the semiconductor substrate has a great influence on thermal oxidization treatment.

FIG. 1 is a graph showing the relationship between the amount of OH groups (relative absorbance at 3300 $cm^{-1}$) in a chemical oxide film on a silicon wafer surface and the thickness of a silicon thermal oxide film. It can be observed that as the relative absorbance at 3300 $cm^{-1}$ increases, the thermal oxide film becomes thicker. This phenomenon is similar to the oxidization rate being higher in Wet oxidization than in Dry oxidization in the case of thermal oxidization using oxidizing gas, and it can be considered that the thickness of the thermal oxide film after the thermal oxidization treatment varies depending on the difference in the amount of OH groups contained in the chemical oxide film formed on the silicon wafer surface.

Note that the amount of OH groups contained in the chemical oxide film can be determined by, for example, investigating infrared absorption properties of the chemical oxide film. As measurement of infrared absorption properties, for example, FT-IR measurement can be performed, and the amount of OH groups can be calculated from the relative absorbance around 3300 $cm^{-1}$. In this case, the value of the relative absorbance around 3300 $cm^{-1}$ can be used as an index indicating the amount of OH groups. In the following description, "the relative absorbance around 3300 $cm^{-1}$" is also sometimes expressed as "the amount of OH groups".

The method for forming a thermal oxide film on a semiconductor substrate according to the second embodiment of the present invention will be described.

(Correlation Acquisition Step)

Firstly, a plurality of semiconductor substrates are prepared in the same manner as in the first embodiment. As the semiconductor substrates, silicon wafers are preferably used. In this case, the thermal oxide film to be formed is a silicon oxide film. Silicon wafers are widely used as semiconductor substrates, and particularly in a device production process, a thermal oxide film is sometimes formed. Therefore, a more accurate evaluation can be performed by forming a thermal oxide film and evaluating the silicon wafer itself.

Next, in order to achieve a state where the prepared semiconductor substrates do not have an oxide film on the surface, the semiconductor substrates are preferably cleaned with HF (hydrofluoric acid). Cleaning is further carried out after removing the oxide film by cleaning with HF. Methods for performing the cleaning after the HF cleaning are not particularly limited. For example, cleaning using a chemical solution such as SC1 cleaning and $O_3$ cleaning can be performed, or cleaning such as pure water rinsing can also be performed. A chemical oxide film is formed on the plurality of prepared semiconductor substrates by the cleaning performed after the HF cleaning. In this event, measures are taken so that the amount of OH groups contained in the respective chemical oxide films of the plurality of semiconductor substrates are different. When the cleaning is performed by a method using a chemical solution, it is possible to achieve semiconductor substrates having different amounts of OH groups in the chemical oxide films simply, by using chemical solutions having different concentrations of OH groups. Therefore, this method is preferable. Furthermore, the SC1 cleaning is preferable since the higher the concentration of $NH_4OH$ and the higher the alkalinity, the greater the absorbance at 3300 $cm^{-1}$ (that is, the more OH groups are contained), and semiconductor substrates having different amounts of OH groups in the chemical oxide film can be achieved more simply by changing the concentration of $NH_4OH$. Since the range in which a correlation between the concentration of the chemical solution and the amount of OH groups can be obtained varies for each cleaning method, it is preferable to perform cleaning employing as many different kinds of cleaning and/or under as many different cleaning conditions as possible and obtain a correlation between a plurality of cleaning conditions and amounts of OH groups when obtaining a correlation.

Next, the amount of OH groups contained in the respective chemical oxide film formed by each cleaning method is measured. In this event, the ATR-FT-IR measurement of the chemical oxide film is preferably performed by using a prism for measuring ATR. ATR-FT-IR measurement can perform the evaluation with sufficient sensitivity to the OH groups present in the semiconductor substrate surface compared with common transmission FT-IR.

FIG. 2 is a graph showing the relationship between the concentration of $NH_4OH$ and the amount of OH groups (relative absorbance at 3300 $cm^{-1}$) in a chemical oxide film, and FIG. 3 is a graph showing the relationship between the concentration of $O_3$ and the amount of OH groups (relative absorbance at 3300 $cm^{-1}$) in a chemical oxide film. There is a correlation between the $NH_4OH$ concentration and the amount of OH groups (relative absorbance around 3300 $cm^{-1}$), but on the other hand, no correlation can be observed between the $O_3$ concentration and the amount of OH groups (relative absorbance around 3300 $cm^{-1}$). In this manner, there is no correlation between the concentration of the chemical solution and the amount of OH groups in some cases depending on the cleaning method.

Next, the plurality of semiconductor substrates each having a different amount of OH groups contained in the chemical oxide film are subjected to a thermal oxidization treatment under identical thermal oxidization treatment conditions to form a thermal oxide film. The formation conditions of the thermal oxide film are not particularly limited, and the formation can be performed by an ordinary method.

Then, the thickness of the formed thermal oxide film is measured. The measurement can be performed, for example, by spectroscopic ellipsometry or the like.

The correlation between the amount of OH groups in the chemical oxide film determined above and the thickness of the formed thermal oxide film is determined. A correlation as in FIG. 1 can be observed between the thickness of the thermal oxide film and the amount of OH groups in the chemical oxide film (relative absorbance around 3300 $cm^{-1}$), and there can be observed a tendency that the greater the amount of OH groups in the chemical oxide film, the thicker the thickness of the thermal oxide film. Using this result, the amount of OH groups in the chemical oxide film is determined so that the thickness of the thermal oxide film to be formed on the semiconductor substrate is a predetermined thickness, and a chemical oxide film that has the determined amount of OH groups is formed. In this manner, a thermal oxide film having a constant thickness can be formed.

Note that the measurement of the amount of OH groups (relative absorbance near 3300 $cm^{-1}$) in the chemical oxide film and the measurement of the thickness of the thermal oxide film can also be carried out by using a monitor wafer or the like that has been subjected to the same cleaning treatment and thermal oxidization treatment as the semiconductor substrate on which a thermal oxide film is to be formed, or by extracting some semiconductor substrates that have been subjected to the same treatments.

(Cleaning Condition Determination Step)

Cleaning conditions are determined, such that the thickness of the thermal oxide film to be formed on a surface of a semiconductor substrate is a predetermined thickness in the same manner as in the first embodiment. On the basis of the correlation obtained in the correlation acquisition step, the amount of OH groups at which a thermal oxide film having a predetermined thickness is formed is determined, and in the meantime, cleaning conditions for forming a chemical oxide film so as to achieve the determined amount of OH groups are determined. In the determination of the cleaning conditions, a correlation between the cleaning conditions and the amount of OH groups can be obtained in advance, and this correlation can be used, for example. For example, in the above-described specific example, when the predetermined thickness of the thermal oxide film intended to be formed is 5.1 nm, it can be seen from the correlation between the thermal oxide film thickness and the amount of OH groups obtained in the correlation acquisition step as in FIG. 1 that the amount of OH groups should be 0.145. Accordingly, cleaning conditions where the amount of OH groups is 0.145 can be selected and determined by using the relationship shown in FIG. 2 and so forth. In this specific example, SC1 cleaning where the concentration of $NH_4OH$ is 0.001 to 0.03% is determined to be performed.

(Substrate Cleaning Step)

Next, in the same manner as in the first embodiment, a semiconductor substrate on which a thermal oxide film is to be actually formed is newly prepared, and cleaning is performed under the cleaning conditions determined in the cleaning condition determination step.

(OH-Group-Amount Measurement Step)

When the amount of OH groups contained in the chemical oxide film formed on the semiconductor substrate by the cleaning performed in the substrate cleaning step is measured, the actual amount of OH groups can be confirmed before performing thermal oxidization. Thus, a thermal oxide film can be formed with further excellent reproducibility. For example, when the amount deviates from the target amount of OH groups, it is also possible to perform HF cleaning to remove the oxide film once, then, once again, determine the cleaning conditions and clean the substrate, and perform the formation of a chemical oxide film that has an amount closer to the target amount of OH groups. Note that, in this case, too, the measurement of the amount of OH groups (relative absorbance around 3300 cm$^{-1}$) in the chemical oxide film can be carried out by using a monitor wafer or the like that has been subjected to the same cleaning treatment as the semiconductor substrate on which a thermal oxide film is to be formed, or by extracting some semiconductor substrates that have been subjected to the same treatments. However, this step does not necessarily need to be performed.

(Thermal Oxide Film Formation Step)

Finally, in the same manner as in the first embodiment, a thermal oxidization treatment is performed under the same conditions as in the thermal oxidization treatment performed in the correlation acquisition step to form a thermal oxide film on the surface of the semiconductor substrate.

By forming a thermal oxide film on the semiconductor substrate through the steps according to the present invention as described above, it is possible to form a thin thermal oxide film of a predetermined thickness with excellent reproducibility.

Note that in the present invention, a more remarkable effect can be achieved when the thickness of the thermal oxide film to be formed on the semiconductor substrate surface is thin and in the range of 1 to 10 nm. Therefore, it is preferable to form a thermal oxide film of such a range.

Third Embodiment

Meanwhile, in a method for forming a thermal oxide film on a semiconductor substrate according to the third embodiment of the present invention, focusing on the difference in the stoichiometric proportions of the constituent elements of the chemical oxide film, the correlation between the stoichiometric proportions of the constituent elements of the chemical oxide film formed on the surface of the cleaned semiconductor substrate and the thickness of the thermal oxide film when the semiconductor substrate has been subjected to thermal oxidization is determined in advance before the thermal oxidization treatment of the semiconductor substrate. The stoichiometric proportions of the constituent elements of the chemical oxide film on the surface of the semiconductor substrate on which a thermal oxide film is to be formed is determined so that the thickness of the thermal oxide film to be formed on the semiconductor substrate is a predetermined thickness, cleaning conditions are adjusted so as to achieve the determined stoichiometric proportions, and a chemical oxide film is formed. In this manner, it is possible to form a thin thermal oxide film of a predetermined thickness with excellent reproducibility.

The present inventors have earnestly investigated the fact that variation occurs in the thickness of the formed thermal oxide film when the method of cleaning the semiconductor substrate is different, and found out that the stoichiometric proportions of the constituent elements of the chemical oxide film formed by cleaning the semiconductor substrate has a great influence on thermal oxidization treatment. Thus, the present inventors have completed a thermal oxidization method that makes it possible to form a thin thermal oxide film having a predetermined thickness with excellent reproducibility by making use of this phenomenon.

The method for forming a thermal oxide film on a semiconductor substrate according to the third embodiment of the present invention will be described.

(Correlation Acquisition Step)

Firstly, a plurality of semiconductor substrates are prepared in the same manner as in the first embodiment. Silicon substrates are preferably used as the semiconductor substrates. In this case, the thermal oxide film to be formed is a silicon oxide film. Silicon substrates are widely used as semiconductor substrates, and particularly in a device production process, a thermal oxide film is sometimes formed. Therefore, a more accurate evaluation can be performed by forming a thermal oxide film and evaluating the silicon substrate itself.

Next, in order to achieve a state where the prepared semiconductor substrates do not have an oxide film on the surface, the semiconductor substrates are preferably cleaned with HF (hydrofluoric acid). Cleaning is further carried out after removing the oxide film by cleaning with HF. Methods for performing the cleaning after the HF cleaning are not particularly limited. For example, cleaning using a chemical solution such as SC1 cleaning and $O_3$ cleaning can be performed, or cleaning such as pure water rinsing can also be performed. A chemical oxide film is formed on the plurality of prepared semiconductor substrates by the cleaning performed after the HF cleaning. In this event, measures are taken so that the stoichiometric proportions of the constituent elements of the respective chemical oxide films of the plurality of semiconductor substrates are different. When the cleaning is performed by a method using a chemical solution, it is possible to achieve semiconductor substrates having different stoichiometric proportions of the constituent elements of the chemical oxide film simply, by using various kinds of chemical solutions having different concentrations. Therefore, this method is preferable. Since the cleaning treatment is for obtaining the correlation, the cleaning is preferably performed employing as many different kinds of cleaning and/or under as many different cleaning conditions as possible. In addition, since the range in which a correlation between the concentration of the chemical solution and the stoichiometric proportions can be obtained varies depending on the cleaning method, it is preferable to perform the cleaning employing as many different kinds of cleaning and/or under as many different cleaning conditions as possible and obtain the correlation between a plurality of cleaning conditions and stoichiometric proportions when obtaining the correlation.

Next, the stoichiometric proportions of the constituent elements of the chemical oxide film formed by the cleaning is determined.

Note that the methods for determining and evaluating the stoichiometric proportions of the constituent elements of the chemical oxide film are not particularly limited, and any method is possible as long as the stoichiometric proportions of the constituent elements of the chemical oxide film can be determined. For example, an XPS method is a method by which it is possible to evaluate the information of the outermost surface layer of the semiconductor substrate simply and with high precision, and can be employed suitably for the evaluation of the stoichiometric proportions according to the present invention. Out of the constituent elements of the chemical oxide film, a peak intensity of a bonding energy in a state where substrate atoms of the semiconductor substrate are not bonded to oxygen atoms and a state where the substrate atoms are bonded to oxygen atoms to form a suboxide and a peak intensity of a bonding energy in a state where the substrate atoms are completely bonded to oxygen atoms can be respectively measured using XPS, and the stoichiometric proportions according to the present invention can be defined as proportions of the measured peak intensities. Alternatively, it is also possible to, for example, irradiate the surface of the semiconductor substrate with He ions by RBS, determine the energy of the atoms that collided from the range of the atoms, and determine the stoichiometric proportions of the constituent elements of the chemical oxide film formed on the semiconductor substrate surface therefrom.

In addition, when the semiconductor substrate is a silicon substrate and the oxide film to be formed is a silicon oxide film, constituent elements of the chemical oxide film are Si and O. In this event, the stoichiometric proportions can be defined as the proportions of atom-bonding states of Si atoms and O atoms in the chemical oxide film, that is, the proportion of an Si—Si bond in a state where silicon atoms are not bonded to oxygen atoms and a so-called suboxide out of Si—O bonds (silicon oxide) in a state where silicon atoms are bonded to oxygen atoms and $SiO_2$ formed by complete bonding with oxygen atoms out of Si—O bonds. The proportion at which the bonds exist can be determined by measuring the peak intensity of the bonding energy by XPS.

An XPS method is, as shown in an example in FIG. 8, a technique of analyzing the composition of elements constituting a surface of a sample or the state of chemical bonds by irradiating the surface of the sample (the surface of the silicon oxide film 3 formed on the silicon 4) with X-ray from an X-ray source 1 and detecting photoelectrons (from outermost electrons) released from the sample surface with a detector 2, and measuring kinetic energy. The X-ray source used for the irradiation in this event is not particularly limited, and as long as the stoichiometric proportions of the constituent elements of the chemical oxide film intended to be measured can be measured, an X-ray source of any energy can be used. Furthermore, the kinetic energy of the released photoelectrons is affected by the state of the electrons around the atoms such as electric charge (valence) of atoms, the distance between atoms, etc. By observing the change in energy (chemical shift), the state of chemical bonds can be discerned relatively easily. The mean free path of photoelectrons is said to be 2.1 nm in silicon and 3.3 nm in a silicon oxide film, and is considered to be a technique particularly suitable for evaluating the outermost surface of a silicon substrate.

FIG. 9 shows an example of an XPS spectrum of a sample in which a thin silicon oxide film is present on a silicon substrate. FIG. 9 illustrates the energy range of the sp3 orbital where the outermost electrons of the silicon are. It is the outermost electrons that contribute to reaction, and inner-shell electrons, which do not contribute to reaction, have been omitted. The horizontal axis is the bonding energy and the vertical axis is the count number of photoelectrons. Since bonding energy varies depending on the bonding state of Si and O, it is possible to evaluate the bonding state and bonded atoms. In addition, the vertical axis is the count number of photoelectrons, and varies depending on the number of each bonding state.

When the chemical oxide film is a silicon oxide film, it is possible to divide into a bonding state caused by Si—Si bonds of 99 to 100 eV ($Si^0$) and a bonding state corresponding to the state in which silicon atoms of 101 to 105 eV are bonded to oxygen atoms ($Si^{1+\ to\ 4+}$) Here, the peak of the Si—Si bonds of $Si^0$ is separated in two because of spin-orbit interaction. In addition, a state in which one oxygen atom is bonded to a silicon atom is $Si^{1+}$, and a state of $SiO_2$ in which four oxygen atoms are bonded to a silicon atom is $Si^{4+}$.

Here, the reason why four bonding states of silicon atoms and oxygen atoms exist is that the oxide film is thin, and does not necessarily have a stoichiometric composition.

Spin-orbit interaction also occurs in Si—O bonds, but is not observed in ordinary XPS due to energy resolution. The bonding energy of $Si^{1+}$ to $Si^{3+}$, corresponding to suboxide has low intensity, cannot be seen clearly. However, the present energy is known from past knowledge, and spectral separation is performed regarding the intensity of each peak, and the intensity is thus determined.

On determination of the stoichiometric proportions of the constituent elements of the silicon oxide film on the silicon substrate, that is, the proportion of the peak intensity of the bonding energy of Si and O, the peak intensity of $Si^{4+}$, being a composition of $SiO_2$ and the peak intensities of each of $Si^0$ to $Si^{3+}$, which can be oxidized by oxygen, were added up. Regarding $Si^{1+\ to\ 3+}$, which do not have clear peaks, spectral separation was performed. That is, Si components that have the possibility of being oxidized were all added up as $Si^{0\ to\ 3+}$ and separated from the $Si^{4+}$ component, the $Si^{4+}$ component having progressed in oxidization and achieved complete stoichiometry. The area of the peak intensity determined as in FIG. 9 was determined and defined as the proportion of the peak intensity.

All of the proportions of the peak intensity of $Si^{0\ to\ 3+}$ obtained in the above manner and the peak intensity of $Si^{4+}$ can be added up, and the proportions (percentages) of each of $Si^{0\ to\ 3+}$ and $Si^{4+}$ can be determined as the proportion of the peak intensities. The correlation between this proportion of peak intensities and the thickness of the thermal oxide film is obtained.

Next, the plurality of semiconductor substrates each having different stoichiometric proportions of the constituent elements of the chemical oxide film are subjected to a thermal oxidization treatment under the same thermal oxidization treatment conditions to form a thermal oxide film. The conditions for the formation of the thermal oxide film are not particularly limited, and the formation can be performed by an ordinary method. Then, the thickness of the formed thermal oxide film is measured. The measurement can be performed, for example, by spectroscopic ellipsometry or the like.

The correlation between the stoichiometric proportions of the constituent elements of the chemical oxide film determined above, that is, the proportions of the peak intensities, and the thickness of the formed thermal oxide film is obtained. FIG. 6 is a graph showing the relationship between the proportion of the peak intensity of $Si^{0\ to\ 3+}$ and the thickness of the thermal oxide film, and FIG. 7 is a graph showing the relationship between the proportion of the peak intensity of $Si^{4+}$ and the thickness of the thermal oxide film. A correlation can be seen between the thickness of the thermal oxide film and the stoichiometric proportions of the constituent elements of the chemical oxide film as in FIG. 6 and FIG. 7, and it can be observed that as the proportion of the peak intensity of $Si^{0\ to\ 3+}$ increases, the thickness of the thermal oxide film becomes thicker. In addition, it can be observed that as the proportion of the peak intensity of $Si^{4+}$ decreases, the thickness of the thermal oxide film becomes thicker. Using this result, the stoichiometric proportions of the constituent elements of the chemical oxide film are determined so that the thickness of the thermal oxide film formed on the semiconductor substrate will be a predetermined thickness, and a chemical oxide film that can achieve the determined stoichiometric proportions is formed. Thus, a thin thermal oxide film having a constant thickness can be formed.

Note that the analysis of the stoichiometric proportions of the constituent elements of the chemical oxide film and the measurement of the thickness of the thermal oxide film can also be carried out by using a monitor wafer or the like that has been subjected to the same cleaning treatment and thermal oxidization treatment as the semiconductor substrate on which a thermal oxide film is to be formed, or by extracting some semiconductor substrates that have been subjected to the same treatments.

(Cleaning Condition Determination Step)

Cleaning conditions are determined, such that the thickness of the thermal oxide film to be formed on a surface of a semiconductor substrate is a predetermined thickness in the same manner as in the first embodiment. On the basis of the correlation obtained in the correlation acquisition step, the proportions of the peak intensities of the bonds of $Si^{0\ to\ 3+}$ and/or $Si^{4+}$, that is, the stoichiometric proportions of the constituent elements of the chemical oxide film at which a thermal oxide film having a predetermined thickness is formed is determined. In the meantime, cleaning conditions for forming a chemical oxide film so as to achieve the determined proportions of peak intensities are determined. In the determination of the cleaning conditions, a correlation between the cleaning conditions and the proportions of peak intensities can be obtained in advance, and this correlation can be used, for example. For example, in the above-described specific example, when the target thickness of the thermal oxide film is 5.15 nm, it can be seen from the correlation between the thermal oxide film thickness and the proportion of the peak intensity of bonds of $Si^{0\ to\ 3+}$ obtained in the correlation acquisition step as in FIG. 6 that the proportion of the peak intensity of bonds of $Si^{0\ to\ 3+}$ should be 84.5%. Accordingly, cleaning conditions where the proportion of the peak intensity is 84.5% can be selected and determined by using the relationship shown in FIG. 10 and so forth. In this specific example, SC1 cleaning where the concentration of $NH_4OH$ is 3% is determined to be performed.

(Substrate Cleaning Step)

Next, in the same manner as in the first embodiment, a semiconductor substrate on which a thermal oxide film is to be actually formed is newly prepared, and cleaning is performed under the cleaning conditions determined in the cleaning condition determination step.

(Thermal Oxide Film Formation Step)

Finally, in the same manner as in the first embodiment, a thermal oxidization treatment is performed under the same conditions as in the thermal oxidization treatment performed in the correlation acquisition step to form a thermal oxide film on the surface of the semiconductor substrate cleaned in the substrate cleaning step.

By forming a thermal oxide film on the semiconductor substrate through the steps according to the present invention as described above, it is possible to form a thin thermal oxide film of a predetermined thickness with excellent reproducibility.

Note that in the present invention, a more remarkable effect can be achieved when the thickness of the thermal oxide film to be formed on the semiconductor substrate surface is thin and in the range of 1 to 10 nm. Therefore, the present invention is suitable for forming a thermal oxide film in such a range.

Fourth Embodiment

Meanwhile, in a method for forming a thermal oxide film on a semiconductor substrate according to the fourth embodiment of the present invention, focusing on the amount of hydrogen atoms contained in the chemical oxide film, the amount of hydrogen atoms in the chemical oxide film formed on the surface of the cleaned semiconductor substrate is measured, and the correlation between the amount of hydrogen atoms and the thickness of the thermal oxide film when the semiconductor substrate has been subjected to thermal oxidization is determined in advance before the thermal oxidization treatment of the semiconductor substrate. Thus, the amount of the hydrogen atoms in the chemical oxide film on a surface of a semiconductor substrate on which a thermal oxide film is to be formed is determined so that the thickness of the thermal oxide film to be formed on the semiconductor substrate will be a predetermined thickness. The cleaning conditions are adjusted so as to achieve the determined amount of hydrogen atoms, and a chemical oxide film is formed. In this manner, it is possible to form a thin thermal oxide film of a predetermined thickness with excellent reproducibility.

The present inventors have earnestly investigated the fact that variation occurs in the thickness of the formed thermal oxide film when the method of cleaning the semiconductor substrate is different, and found out that the amount of hydrogen atoms in the chemical oxide film formed by cleaning the semiconductor substrate has a great influence on thermal oxidization treatment. Thus, the present inventors have completed a thermal oxidization method that makes it possible to form a thin thermal oxide film having a predetermined thickness with excellent reproducibility by making use of this phenomenon.

The method for forming a thermal oxide film on a semiconductor substrate according to the fourth embodiment of the present invention will be described.

(Correlation Acquisition Step)

Firstly, a plurality of semiconductor substrates are prepared in the same manner as in the first embodiment. As the semiconductor substrates, silicon wafers are preferably used. In this case, the thermal oxide film to be formed is a silicon oxide film. Silicon wafers are widely used as semiconductor substrates, and particularly in a device production process, a thermal oxide film is sometimes formed. Therefore, a more accurate evaluation can be performed by forming a thermal oxide film and evaluating the silicon wafer itself.

Next, in order to achieve a state where the prepared semiconductor substrates do not have an oxide film on the surface, the semiconductor substrates are preferably cleaned with HF (hydrofluoric acid). Cleaning is further carried out after removing the oxide film by cleaning with HF. Methods for performing the cleaning after the HF cleaning are not particularly limited. For example, cleaning using a chemical solution such as SC1 cleaning and $O_3$ cleaning can be performed, or cleaning such as pure water rinsing can also be performed. A chemical oxide film is formed on the plurality of prepared semiconductor substrates by the cleaning performed after the HF cleaning. In this event, measures are taken so that the amount of hydrogen atoms in the respective chemical oxide films of the plurality of semiconductor substrates are different. When the cleaning is performed by a method using a chemical solution, it is possible to achieve semiconductor substrates having different amounts of hydrogen atoms in the chemical oxide film simply, by using various kinds of chemical solutions having different concentrations. Therefore, this method is preferable. Furthermore, the SC1 cleaning is preferable since the higher the concentration of $NH_4OH$ and the higher the alkalinity, the smaller the proportion of hydrogen atoms or absorbance at 2130 cm$^{-1}$ (that is, the smaller the amount of hydrogen atoms contained), and semiconductor substrates having different amounts of hydrogen atoms can be achieved more simply by changing the concentration of NH$_4$OH. Since the cleaning treatment is for obtaining the correlation, the cleaning is preferably performed employing as many different kinds of cleaning and/or under as many different cleaning conditions as possible. In addition, since the range in which a correlation between the concentration of the chemical solution and the amount of hydrogen atoms can be obtained varies depending on the cleaning method, it is preferable to perform the cleaning employing as many different kinds of cleaning and/or under as many different cleaning conditions as possible and obtain the correlation between a plurality of cleaning conditions and the amount of hydrogen atoms when obtaining the correlation.

Next, the amount of hydrogen atoms in the chemical oxide film formed by the cleaning is determined.

Note that the methods for determining and evaluating the amount of hydrogen atoms in the chemical oxide film are not particularly limited, and any method is possible as long as the amount of hydrogen atoms in the chemical oxide film can be determined. For example, the amount of hydrogen atoms can be determined by studying the infrared absorption properties of the chemical oxide film. To assess infrared absorption properties, for example, ATR-FT-IR measurement can be performed, and the amount of hydrogen atoms can be calculated from the absorbance around 2130 cm$^{-1}$. In this case, the absorbance around 2130 cm$^{-1}$ is the value of relative absorbance corresponding to the stretching vibration of Si—H in SiH$_3$, and can be an index indicating the amount of hydrogen atoms. As another way of determining the amount of hydrogen atoms, for example, Rutherford Backscattering Spectroscopy (RBS) can be performed to determine the proportion of hydrogen atoms in the chemical oxide film, and the amount of hydrogen atoms can be calculated. In this case, the proportion of hydrogen atoms can be an index showing the amount of hydrogen atoms. In the following, "the absorbance at 2130 cm$^{-1}$" and "the proportion of hydrogen atoms" are sometimes referred to as "the amount of hydrogen atoms".

Next, the plurality of semiconductor substrates each having a different amount of hydrogen atoms in the chemical oxide film are subjected to a thermal oxidization treatment under the same thermal oxidization treatment conditions to form a thermal oxide film. The conditions for the formation of the thermal oxide film are not particularly limited, and the formation can be performed by an ordinary method. Then, the thickness of the formed thermal oxide film is measured. The measurement can be performed, for example, by spectroscopic ellipsometry or the like.

The correlation between the amount of hydrogen atoms in the chemical oxide film determined above and the thickness of the formed thermal oxide film is determined. FIG. 14 is a graph showing the relationship between the amount of hydrogen atoms (the proportion of hydrogen atoms in the chemical oxide film) determined by RBS measurement and the thickness of the thermal oxide film, and FIG. 15 is a graph showing the relationship between the amount of hydrogen atoms (absorbance at 2130 cm$^{-1}$) determined by ATR-FT-IR measurement and the thickness of the thermal oxide film. A correlation as in FIG. 14 and FIG. 15 can be observed between the thickness of the thermal oxide film and the amount of hydrogen atoms in the chemical oxide film, and there can be observed a tendency that the greater the amount of hydrogen atoms, the thinner the thickness of the thermal oxide film. As a factor for the observation of such a tendency, for example, as shown in Non Patent Document 1, it is known that silicon terminated with hydrogen has a stabilized surface and becomes inactivated. From this phenomenon, it can be considered that the oxidization rate varies depending on the difference in the amount of hydrogen atoms contained in the chemical oxide film formed on the surface by cleaning, and that the film thickness after the thermal oxidization varies even when thermal oxidization is performed under the same conditions. Using the results of FIG. 14 and FIG. 15, the amount of hydrogen atoms in the chemical oxide film is determined so that the thickness of the thermal oxide film formed on the semiconductor substrate will be a predetermined thickness, and a chemical oxide film that can achieve the determined amount of hydrogen atoms is formed. Thus, a thin thermal oxide film having a constant thickness can be formed.

Note that the analysis of the amount of hydrogen atoms in the chemical oxide film and the measurement of the thickness of the thermal oxide film can also be carried out by using a monitor wafer or the like that has been subjected to the same cleaning treatment and thermal oxidization treatment as the semiconductor substrate on which a thermal oxide film is to be formed, or by extracting some semiconductor substrates that have been subjected to the same treatments.

(Cleaning Condition Determination Step)

Cleaning conditions are determined, such that the thickness of the thermal oxide film to be formed on a surface of a semiconductor substrate is a predetermined thickness in the same manner as in the first embodiment. On the basis of the correlation obtained in the correlation acquisition step, the amount of hydrogen atoms at which a thermal oxide film having a predetermined thickness is formed is determined, and in the meantime, cleaning conditions for forming a chemical oxide film so as to achieve the determined amount of hydrogen atoms are determined. In the determination of the cleaning conditions, a correlation between the cleaning conditions and the amount of hydrogen atoms can be obtained in advance, and this correlation can be used, for example.

For example, in the above-described specific example, when the target thickness of the thermal oxide film is 5.10 nm, it can be seen from the correlation between the thermal oxide film thickness and the proportion of hydrogen atoms obtained in the correlation acquisition step as in FIG. 14 that the proportion of hydrogen atoms should be 20%. Accordingly, cleaning conditions where the amount of hydrogen atoms is 20% can be selected and determined by using the relationship shown in FIG. 16 and so forth. In this specific example, SC1 cleaning where the concentration of NH$_4$OH is 0.03% is determined to be performed.

(Substrate Cleaning Step)

Next, in the same manner as in the first embodiment, a semiconductor substrate on which a thermal oxide film is to be actually formed is newly prepared, and cleaning is performed under the cleaning conditions determined in the cleaning condition determination step.

(Hydrogen-Atom-Amount Measurement Step)

When the amount of hydrogen atoms contained in the chemical oxide film formed on the semiconductor substrate by the cleaning performed in the substrate cleaning step is measured, the actual amount of hydrogen atoms can be confirmed before performing thermal oxidization. Thus, a thermal oxide film can be formed with further excellent reproducibility. For example, when the amount deviates from the target amount of hydrogen atoms, it is also possible to perform HF cleaning to remove the chemical oxide film once, then, once again, determine the cleaning conditions and clean the substrate, and perform the formation of a chemical oxide film that has an amount closer to the target amount of hydrogen atoms. Note that, in this case, too, the measurement of the amount of hydrogen atoms (the absorbance around 2130 cm$^{-1}$ according to an ATR-FT-IR measurement or the proportion of hydrogen atoms according to an RBS measurement) in the chemical oxide film can be carried out by using a monitor wafer or the like that has been subjected to the same cleaning treatment as the semiconductor substrate on which a thermal oxide film is to be formed, or by extracting some semiconductor substrates that have been subjected to the same treatments. However, this step does not necessarily need to be performed.

(Thermal Oxide Film Formation Step)

Finally, in the same manner as in the first embodiment, a thermal oxidation treatment is performed under the same conditions as in the thermal oxidation treatment performed in the correlation acquisition step to form a thermal oxide film on the surface of the semiconductor substrate cleaned in the substrate cleaning step.

By forming a thermal oxide film on the semiconductor substrate through the steps according to the present invention as described above, it is possible to form a thin thermal oxide film of a predetermined thickness with excellent reproducibility.

Note that in the present invention, a more remarkable effect can be achieved when the thickness of the thermal oxide film to be formed on the semiconductor substrate surface is thin and in the range of 1 to 10 nm. Therefore, the present invention is suitable for forming a thermal oxide film in such a range.

EXAMPLE

Hereinafter, the present invention will be described specifically with reference to Examples, but the present invention is not limited thereto.

Example 1

A plurality of boron-doped silicon single crystal substrates having a diameter of 300 mm and a usual resistivity were prepared, and after cleaning the surface of the silicon single crystal substrates with 0.5% HF for initialization, SC1 cleaning was performed at 70° C. In this event, the concentration of NH$_4$OH was altered to be 3, 0.3, 0.03, and 0.001%. In addition, as a different cleaning, O$_3$ cleaning (24° C.) was performed with the concentration of O$_3$ varied to 3, 20, and 40 ppm.

Subsequently, a test piece having a size of a few centimeters square was cut out of each silicon single crystal substrate cleaned under the respective cleaning conditions beforehand and ATR-FT-IR measurement (attenuated total reflectance Fourier transform infrared spectroscopy) was performed to measure the relative absorbance at 3300 cm$^{-1}$, and the concentration of NH$_4$OH and the concentration of O$_3$ were compared with the amount of OH groups (relative absorbance around 3300 cm$^{-1}$) in the chemical oxide film. The results are shown in FIG. 2 and FIG. 3. As shown in FIG. 2, it can be observed that as the NH$_4$OH concentration increases, the amount of OH groups (relative absorbance around 3300 cm$^{-1}$) also increases, and many OH groups are contained. On the other hand, as shown in FIG. 3, in the case of O$_3$, no dependence on the amount of OH groups (relative absorbance around 3300 cm$^{-1}$) was found in the O$_3$ concentration.

The reason why the amount of OH groups (relative absorbance around 3300 cm$^{-1}$) varies depending on the cleaning conditions can be considered to be that in the case of SC1 cleaning, the higher the NH$_4$OH concentration and the higher the alkalinity, the more OH groups are contained, but in the case of O$_3$ cleaning, the chemical solution is almost neutral, and the amount of OH groups is small.

Next, a different wafer that has been cleaned under the same cleaning conditions as the wafers from which a test piece was cut out for ATR-FT-IR evaluation was subjected to oxidation (900° C., oxygen: 5%, 60 min) with the aim of obtaining a thermal oxide film having a thickness of 5.1 nm. Then, the thickness of the thermal oxide film was measured by spectroscopic ellipsometry. The results are shown in FIG. 4 and FIG. 5. FIG. 4 is a graph showing the relationship between the NH$_4$OH concentration and the thermal oxide film thickness. FIG. 5 is a graph showing the relationship between the O$_3$ concentration and the thermal oxide film thickness.

From the above results, a correlation between the thickness of the thermal oxide film and the relative absorbance around 3300 cm$^{-1}$ as shown in FIG. 1 was obtained. As shown in FIG. 1, a correlation was observed between the thermal oxide film thickness and the relative absorbance around 3300 cm$^{-1}$, and a tendency was observed that the greater the amount of OH groups in the chemical oxide film formed after the cleaning, the thicker the thermal oxide film. It was revealed that by making use of the correlation between the thickness of the thermal oxide film and the amount of OH groups (relative absorbance around 3300 cm$^{-1}$) shown in FIG. 1 to determine the cleaning conditions for actually forming a thermal oxide film, it is possible to form a thermal oxide film having a thickness close to the target thermal oxide film thickness.

Next, cleaning conditions of SC1 cleaning under which the thickness of the thermal oxide film becomes 5.1 nm were considered. It was shown from FIG. 1 that to realize this thermal oxide film thickness, the absorbance at 3300 cm$^{-1}$ needed to be 0.145, and to achieve this absorbance, it was shown from FIG. 2 that the concentration of NH$_4$OH can be 0.001 to 0.03%. Accordingly, when the silicon single crystal substrate was cleaned with the NH$_4$OH in the SC1 cleaning adjusted to be 0.03%, and then the above-described thermal oxidation treatment was performed, the thickness of the thermal oxide film was 5.1 nm, and the same thickness as the target thickness was successfully achieved.

As shown above, it is possible to form a thermal oxide film having an even and constant thickness with excellent reproducibility by making use of the correlation determined beforehand to set the thermal oxidation treatment conditions to the same conditions as in the correlation acquisition step and adjust the cleaning conditions so that the amount of OH groups at which the target thermal oxide film thickness can be obtained is achieved. As a result, it has been shown that control of a thermal oxidation process is facilitated.

Example 2

Boron-doped silicon single crystal substrates having a diameter of 300 mm and a usual resistivity were prepared, and after cleaning the surface of the silicon substrates with 0.5% HF for initialization, SC1 cleaning was performed at 70° C. In this event, the concentration of NH$_4$OH was altered to be 3, 0.3, 0.03, and 0.01%. In addition, as a different cleaning, O$_3$ cleaning (24° C.) was performed with the concentration of O$_3$ varied to 3, 20, and 40 ppm.

Subsequently, a test piece was cut out of each silicon single crystal substrate beforehand and XPS measurement was performed to measure the peak intensities of $Si^{0\ to\ 3+}$ and $Si^{4+}$, and the concentration of $NH_4OH$ and the proportions of the peak intensities of $Si^{0\ to\ 3+}$ and Si were compared. The results are shown in FIG. 10 and FIG. 11. FIG. 10 is a graph showing the relationship between the $NH_4OH$ concentration and the proportion of the peak intensity of $Si^{0\ to\ 3+}$ FIG. 11 is a graph showing the relationship between the $NH_4OH$ concentration and the proportion of the peak intensity of $Si^{4+}$. In addition, the peak intensities were measured in the same manner and the concentration of $O_3$ was compared with the proportions of the peak intensities of $Si^{0\ to\ 3+}$ and $Si^{4+}$. The results are shown in FIG. 12 and FIG. 13. FIG. 12 is a graph showing the relationship between the $O_3$ concentration and the proportion of the peak intensity of $Si^{0\ to\ 3+}$. FIG. 13 is a graph showing the relationship between the $O_3$ concentration and the proportion of the peak intensity of $Si^{4+}$. As a result, there is a tendency that as the $NH_4OH$ concentration increases, the proportion of the peak intensity of $Si^{0\ to\ 3+}$ increases, but on the contrary, the proportion of the peak intensity of $Si^{4+}$ decreases. On the other hand, in the case of $O_3$, no dependence on the proportion of the peak intensity was found in the $O_3$ concentration. In this manner, there is no correlation between the concentration of the chemical solution and the proportions of the peak intensities of the constituent elements of the chemical oxide film in some cases depending on the cleaning method.

Such substrates were all subjected to thermal oxidation (900° C., oxygen: 5%, 60 min) with the aim of making the thickness of the thermal oxide film about 5.1 nm, and then the thickness of the thermal oxide film was measured by spectroscopic ellipsometry.

Correlations as shown in FIG. 6 and FIG. 7 were obtained from the results of the experiment conducted as described above. As shown in FIG. 6 and FIG. 7, correlations were seen between the thickness of the thermal oxide film and the proportions of the peak intensities of $Si^{0\ to\ 3+}$ and $Si^{4+}$, and it was shown that the greater the proportion of the peak intensity of $Si^{0\ to\ 3+}$, the thicker the thickness of thermal oxide film tended to be, and that the smaller the proportion of the peak intensity of $Si^{4+}$, the thicker the thickness of the thermal oxide film tended to be. No dependence of the $O_3$ concentration on the stoichiometric proportions was observed, but a good correlation was seen between the stoichiometric proportions and the thickness of the thermal oxide film formed after $O_3$ cleaning. In addition, it was found that from the correlation between the thickness of the thermal oxide film and the proportion of the peak intensity of the constituent elements of the chemical oxide film shown in FIG. 6 and FIG. 7, a calibration line such as the dotted line in FIG. 6 and FIG. 7 can be drawn, for example. When the conditions for actually forming a thermal oxide film are determined from this calibration line, a thermal oxide film close to the target thermal oxide film thickness can be formed. The dotted lines in FIG. 6 and FIG. 7 are calibration lines. The equation for each calibration line is as follows.

(oxide film thickness nm)=0.0342×(proportion of peak intensity of $Si^{0\ to\ 3+}$)+2.26

(oxide film thickness nm)=−0.0342×(proportion of peak intensity of $Si^{4+}$)+5.68

Next, cleaning conditions of SC1 cleaning under which the thickness of the thermal oxide film becomes 5.15 nm were considered. To realize this thermal oxide film thickness, the proportion of the peak intensity of $Si^{0\ to\ 3+}$ needs to be 84.5% according to FIG. 6, and the proportion of the peak intensity of $Si^{4+}$ needs to be 15.5% according to FIG. 7. To achieve this value, it was shown from the graph of the $NH_4OH$ concentration and the proportion of the peak intensity of $Si^{0\ to\ 3+}$ shown in FIG. 10 and the graph of the $NH_4OH$ concentration and the proportion of the peak intensity of $Si^{4+}$ shown in FIG. 11 that the $NH_4OH$ concentration can be 3%. Accordingly, when the silicon single crystal substrate was cleaned with the $NH_4OH$ concentration in the SC1 cleaning adjusted to be 3%, and then a thermal oxidization treatment was performed under conditions identical to when the correlation was obtained, the thickness of the thermal oxide film was 5.16 nm, and the target thickness was successfully achieved.

As shown above, it is possible to form a thin thermal oxide film having an even and constant thickness with excellent reproducibility by making use of the correlation determined beforehand to set the thermal oxidization treatment conditions to the same conditions as in the correlation acquisition step and adjust the cleaning conditions so that the stoichiometric proportions of the constituent elements of the chemical oxide film at which the target thermal oxide film thickness can be obtained is achieved. As a result, it has been shown that control of a thermal oxidation process is facilitated.

Experimental Example 1

A method for adjusting the thermal oxidation treatment conditions by RBS measurement so that the thickness of the thermal oxide film becomes a target thickness will be described.

Firstly, boron-doped silicon wafers having a diameter of 300 mm and a usual resistivity were prepared, and after cleaning the surface of the silicon wafers with 0.5% HF for initialization, SC1 cleaning was performed at 70° C. In this event, the concentration of $NH_4OH$ was altered to be 3, 0.3, 0.03, and 0.001%.

Subsequently, a test piece was cut out of each silicon wafer beforehand and RBS measurement was performed to measure the proportion of hydrogen atoms, and the concentration of $NH_4OH$ was compared with the proportion of hydrogen atoms. The results are shown in FIG. 16. FIG. 16 is a graph showing the relationship between the $NH_4OH$ concentration and the proportion of hydrogen atoms in the chemical oxide film determined by the RBS measurement. As a result, it was observed that as the $NH_4OH$ concentration increases, the proportion of hydrogen atoms decreases, as shown in FIG. 16. It can be considered that the proportion of hydrogen atoms varies depending on the cleaning conditions because, in the case of SC1 cleaning, the higher the $NH_4OH$ concentration and the higher the alkalinity, the fewer the hydrogen atoms.

Such wafers were all subjected to thermal oxidation (900° C., oxygen: 5%, 60 min) with the aim of making the thickness of the thermal oxide film 5.10 nm, and then the thickness of the thermal oxide film was measured by spectroscopic ellipsometry.

The correlation shown in FIG. 14 was obtained from the results of the experiment conducted as described above. As shown in FIG. 14, a correlation was seen between the thickness of the thermal oxide film and the proportion of hydrogen atoms in the cleaned chemical oxide film, and a tendency was observed that the larger the proportion of hydrogen atoms in the cleaned chemical oxide film, the thinner the film thickness. It was revealed that by making use of the correlation between the thickness of the thermal oxide film and the amount of hydrogen atoms (the proportion of hydrogen atoms in the chemical oxide film determined by RBS measurement) shown in FIG. 14 to determine the cleaning conditions for actually forming a thermal oxide film, it is possible to form a thermal oxide film having a thickness close to the target thermal oxide film thickness.

Experimental Example 2

Furthermore, as a different method, a method for adjusting the thermal oxidation treatment conditions by ATR-FT-IR measurement so that the thickness of the thermal oxide film becomes a target thickness will be described.

Firstly, silicon wafers identical to the silicon wafers prepared in Experimental Example 1 were prepared. Then, a test piece was cut out of each silicon wafer, ATR-FT-IR measurement was performed to measure the absorbance around 2130 cm$^{-1}$, and the concentration of $NH_4OH$ was compared with the absorbance around 2130 cm$^{-1}$. The results are shown in FIG. 17. FIG. 17 is a graph showing the relationship between the $NH_4OH$ concentration and the absorbance at 2130 cm$^{-1}$ determined by the ATR-FT-IR measurement. As a result, it was observed that as the $NH_4OH$ concentration increases, the absorbance around 2130 cm$^{-1}$ decreases, and the amount of hydrogen atoms in the cleaned chemical oxide film decreases.

When such wafers were all subjected to a thermal oxidization treatment in the same manner as in Experimental Example 1, the correlation as shown in FIG. 15 was obtained. As shown in FIG. 15, a correlation was seen between the thickness of the thermal oxide film and the absorbance of the cleaned chemical oxide film around 2130 cm$^{-1}$, and a tendency that the greater the absorbance of the cleaned chemical oxide film around 2130 cm$^{-1}$, the thinner the film thickness was observed. It was revealed that by making use of the correlation between the thickness of the thermal oxide film and the amount of hydrogen atoms (absorbance around 2130 cm$^{-1}$) shown in FIG. 15 to determine the cleaning conditions for actually forming a thermal oxide film, it is possible to form a thermal oxide film having a thickness close to the target thermal oxide film thickness.

Example 3

In the same manner as in the Experimental Example 1, the correlation between the proportion of hydrogen atoms measured by RBS and the thickness of the thermal oxide film was determined. Firstly, a plurality of boron-doped silicon wafers having a diameter of 300 mm and a usual resistivity were prepared, and after cleaning the silicon wafer surface with 0.5% HF for initialization, each silicon wafer was subjected to SC1 cleaning (70° C., $NH_4OH$ concentration: 3, 0.3, 0.03, and 0.001%). Thus, substrates having different proportions of hydrogen atoms were fabricated. Next, a test piece was cut out from each silicon wafer and subjected to RBS measurement to measure the proportion of hydrogen atoms. After that, a predetermined thermal oxidation treatment (900° C., oxygen: 5%, 60 min) was performed on each substrate of the different cleaning conditions, the thickness of each thermal oxide film was measured, and the correlation between the proportion of hydrogen atoms and the thickness of the thermal oxide film was determined. In this event, the thickness of the thermal oxide film at which to obtain the correlation was set to be around 5.10 nm. In this manner, the correlation shown in FIG. 14 was obtained.

From the data obtained in the process of obtaining the correlation, the $NH_4OH$ concentration and the proportion of hydrogen atoms were compared. The results are shown in FIG. 16. FIG. 16 is a graph showing the relationship between the $NH_4OH$ concentration and the proportion of hydrogen atoms. As a result, it has been shown that there is a tendency that as the concentration of $NH_4OH$ increases, the proportion of hydrogen atoms decreases.

Next, cleaning conditions of SC1 cleaning under which the thickness of the thermal oxide film becomes 5.10 nm were considered. According to FIG. 14, the proportion of hydrogen atoms needs to be 20% to realize this thermal oxide film thickness. To achieve this value, it was shown from the graph of the relationship between the $NH_4OH$ concentration and the proportion of hydrogen atoms shown in FIG. 16 that the $NH_4OH$ concentration can be 0.03%. Accordingly, when the silicon substrate was cleaned with the $NH_4OH$ concentration in the SC1 cleaning adjusted to be 0.03%, and then a thermal oxidization treatment was performed under conditions identical to when the correlation was obtained, the thickness of the thermal oxide film was 5.10 nm, and the target thickness was successfully achieved.

Example 4

In the same manner as in the Experimental Example 2, the correlation between the absorbance around 2130 cm$^{-1}$ measured by ATR-FT-IR and the thickness of the thermal oxide film was determined. Firstly, a plurality of boron-doped silicon wafers having a diameter of 300 mm and a usual resistivity were prepared, and after cleaning the silicon wafer surface with 0.5% HF for initialization, each silicon wafer was subjected to SC1 cleaning (70° C., $NH_4OH$ concentration: 3, 0.3, 0.03, and 0.001%). Thus, substrates having a different absorbance around 2130 cm$^{-1}$ were fabricated. Next, a test piece was cut out from each silicon wafer and subjected to ATR-FT-IR measurement to measure the absorbance near 2130 cm$^{-1}$. After that, a predetermined thermal oxidization treatment (900° C., oxygen: 5%, 60 min) was performed on each substrate of the different cleaning conditions, the thickness of each thermal oxide film was measured, and the correlation between the absorbance around 2130 cm$^{-1}$ and the thickness of the thermal oxide film was determined. In this event, the thickness of the thermal oxide film at which to obtain the correlation was set to be around 5.10 nm. In this manner, the correlation shown in FIG. 15 was obtained.

From the data obtained in the process of obtaining the correlation, the $NH_4OH$ concentration and the absorbance around 2130 cm$^{-1}$ were compared. The results are shown in FIG. 17. FIG. 17 is a graph showing the relationship between the $NH_4OH$ concentration and the absorbance around 2130 cm$^{-1}$. As a result, it has been shown that there is a tendency that as the concentration of $NH_4OH$ increases, the absorbance around 2130 cm$^{-1}$ decreases.

Next, cleaning conditions of SC1 cleaning under which the thickness of the thermal oxide film becomes 5.10 nm were considered. According to FIG. 15, the absorbance around 2130 cm$^{-1}$ needs to be 1.0 to realize this thermal oxide film thickness. To achieve this value, it was shown from the graph of the relationship between the $NH_4OH$ concentration and the absorbance around 2130 cm$^{-1}$ shown in FIG. 17 that the $NH_4OH$ concentration can be 0.03%. Accordingly, when the silicon substrate was cleaned with the $NH_4OH$ concentration in the SC1 cleaning adjusted to be 0.03%, and then a thermal oxidization treatment was performed under conditions identical to when the correlation was obtained, the thickness of the thermal oxide film was 5.10 nm, and the target thickness was successfully achieved.

As shown in Examples 3 and 4, it is possible to form a thin thermal oxide film having an even and constant thickness with excellent reproducibility by making use of the correlation determined beforehand to set the thermal oxidization treatment conditions to the same conditions as in the correlation acquisition step and adjust the cleaning conditions so that the amount of hydrogen atoms at which the target thermal oxide film thickness can be obtained is achieved. As a result, it has been shown that control of a thermal oxidization process is facilitated.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for forming a thermal oxide film on a semiconductor substrate, comprising:
   a correlation acquisition step of providing a plurality of semiconductor substrates each having a chemical oxide film formed by cleaning, each chemical oxide film having a different constitution, subjecting the plurality of semiconductor substrates to a thermal oxidization treatment under identical thermal oxidization treatment conditions to form a thermal oxide film, and determining a correlation between the constitution of the chemical oxide film and a thickness of the thermal oxide film in advance;
   a cleaning condition determination step of determining the constitution of the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined constitution of the chemical oxide film;
   a substrate cleaning step of cleaning the semiconductor substrate under the cleaning conditions determined in the cleaning condition determination step; and
   a thermal oxide film formation step of performing a thermal oxidization treatment on the semiconductor substrate cleaned in the substrate cleaning step under conditions identical to the thermal oxidization treatment conditions in the correlation acquisition step to form a thermal oxide film on a surface of the semiconductor substrate.

2. The method for forming a thermal oxide film on a semiconductor substrate according to claim 1, wherein the semiconductor substrate is a silicon wafer and the thermal oxide film is a silicon oxide film.

3. The method for forming a thermal oxide film on a semiconductor substrate according to claim 1, wherein the predetermined thickness is 1 to 10 nm.

4. A method for forming a thermal oxide film on a semiconductor substrate, comprising:
   a correlation acquisition step of providing a plurality of semiconductor substrates each having a chemical oxide film formed by cleaning, each chemical oxide film having a different amount of OH groups contained in the chemical oxide film, subjecting the plurality of semiconductor substrates to a thermal oxidization treatment under identical thermal oxidization treatment conditions to form a thermal oxide film, and determining a correlation between the amount of OH groups in the chemical oxide film and a thickness of the thermal oxide film in advance;
   a cleaning condition determination step of determining the amount of OH groups in the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined amount of OH groups;
   a substrate cleaning step of cleaning the semiconductor substrate under the cleaning conditions determined in the cleaning condition determination step; and
   a thermal oxide film formation step of performing a thermal oxidization treatment on the semiconductor substrate cleaned in the substrate cleaning step under conditions identical to the thermal oxidization treatment conditions in the correlation acquisition step to form a thermal oxide film on a surface of the semiconductor substrate.

5. The method for forming a thermal oxide film on a semiconductor substrate according to claim 4, wherein the amount of OH groups is obtained by performing an ATR-FT-IR measurement of the chemical oxide film by using a prism for measuring ATR and is calculated from absorbance of OH groups around 3300 $cm^{-1}$.

6. The method for forming a thermal oxide film on a semiconductor substrate according to claim 4, further comprising, after the substrate cleaning step and before the thermal oxide film formation step, an OH-group-amount measurement step of measuring an amount of OH groups contained in a chemical oxide film formed on the semiconductor substrate by the cleaning performed in the substrate cleaning step.

7. The method for forming a thermal oxide film on a semiconductor substrate according to claim 4, wherein the semiconductor substrate is a silicon wafer and the thermal oxide film is a silicon oxide film.

8. The method for forming a thermal oxide film on a semiconductor substrate according to claim 4, wherein the predetermined thickness is 1 to 10 nm.

9. A method for forming a thermal oxide film on a semiconductor substrate, comprising:
   a correlation acquisition step of providing a plurality of semiconductor substrates each having a chemical oxide film formed by cleaning, each chemical oxide film having different stoichiometric proportions of constituent elements of the chemical oxide film, subjecting the plurality of semiconductor substrates to a thermal oxidization treatment under identical thermal oxidization treatment conditions to form a thermal oxide film, and determining a correlation between the stoichiometric proportions of the constituent elements of the chemical oxide film and a thickness of the thermal oxide film in advance;
   a cleaning condition determination step of determining the stoichiometric proportions of the constituent elements of the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined stoichiometric proportions;

a substrate cleaning step of cleaning the semiconductor substrate under the cleaning conditions determined in the cleaning condition determination step; and a thermal oxide film formation step of performing a thermal oxidization treatment on the semiconductor substrate cleaned in the substrate cleaning step under conditions identical to the thermal oxidization treatment conditions in the correlation acquisition step to form a thermal oxide film on a surface of the semiconductor substrate.

10. The method for forming a thermal oxide film on a semiconductor substrate according to claim 9, wherein regarding the stoichiometric proportions of the constituent elements of the chemical oxide film, out of the constituent elements of the chemical oxide film, a peak intensity of a bonding energy in a state where substrate atoms of the semiconductor substrate are not bonded to oxygen atoms and a state where the substrate atoms are bonded to oxygen atoms to form a suboxide and a peak intensity of a bonding energy in a state where the substrate atoms are completely bonded to oxygen atoms are respectively measured using XPS, and the stoichiometric proportions are defined as proportions of the measured peak intensities.

11. The method for forming a thermal oxide film on a semiconductor substrate according to claim 9, wherein the semiconductor substrate is a silicon wafer and the thermal oxide film is a silicon oxide film.

12. The method for forming a thermal oxide film on a semiconductor substrate according to claim 9, wherein the predetermined thickness is 1 to 10 nm.

13. A method for forming a thermal oxide film on a semiconductor substrate, comprising:

a correlation acquisition step of providing a plurality of semiconductor substrates each having a chemical oxide film formed by cleaning, each chemical oxide film having a different amount of hydrogen atoms contained in the chemical oxide film, subjecting the plurality of semiconductor substrates to a thermal oxidization treatment under identical thermal oxidization treatment conditions to form a thermal oxide film, and determining a correlation between the amount of hydrogen atoms in the chemical oxide film and a thickness of the thermal oxide film in advance;

a cleaning condition determination step of determining the amount of hydrogen atoms in the chemical oxide film based on the correlation obtained in the correlation acquisition step so that a thickness of a thermal oxide film to be formed on a semiconductor substrate on which a thermal oxide film is to be formed is a predetermined thickness, and determining cleaning conditions for forming a chemical oxide film having the determined amount of hydrogen atoms;

a substrate cleaning step of cleaning the semiconductor substrate under the cleaning conditions determined in the cleaning condition determination step; and a thermal oxide film formation step of performing a thermal oxidization treatment on the semiconductor substrate cleaned in the substrate cleaning step under conditions identical to the thermal oxidization treatment conditions in the correlation acquisition step to form a thermal oxide film on a surface of the semiconductor substrate.

14. The method for forming a thermal oxide film on a semiconductor substrate according to claim 13, wherein the semiconductor substrate is a silicon wafer and the thermal oxide film is a silicon oxide film.

15. The method for forming a thermal oxide film on a semiconductor substrate according to claim 14, wherein the amount of hydrogen atoms is obtained by performing an ATR-FT-IR measurement of the chemical oxide film by using a prism for measuring ATR and is calculated from absorbance of $SiH_3$ groups around 2130 $cm^{-1}$.

16. The method for forming a thermal oxide film on a semiconductor substrate according to claim 13, wherein the amount of hydrogen atoms is obtained by performing an RBS measurement of the chemical oxide film and is calculated from a determined proportion of hydrogen atoms in the chemical oxide film.

17. The method for forming a thermal oxide film on a semiconductor substrate according to claim 13, further comprising, after the substrate cleaning step and before the thermal oxide film formation step, a hydrogen-atom-amount measurement step of measuring an amount of hydrogen atoms contained in a chemical oxide film formed on the semiconductor substrate by the cleaning performed in the substrate cleaning step.

18. The method for forming a thermal oxide film on a semiconductor substrate according to claim 13, wherein the predetermined thickness is 1 to 10 nm.

* * * * *